United States Patent [19]
Iwasaki

[11] Patent Number: 5,884,114
[45] Date of Patent: Mar. 16, 1999

[54] IMAGE FORMING DEVICE

[75] Inventor: Takeo Iwasaki, Nagoya, Japan

[73] Assignee: Brother Kogyo Kabushiki Kaisha, Nagoya, Japan

[21] Appl. No.: 955,459

[22] Filed: Oct. 21, 1997

[30] Foreign Application Priority Data

Oct. 24, 1996 [JP] Japan .................................... 8-301136

[51] Int. Cl.⁶ ..................................................... B03D 5/02
[52] U.S. Cl. ........................... 396/583; 355/406; 355/407; 355/27
[58] Field of Search .................................... 355/406, 407, 355/27–29; 430/138, 211; 396/583, 32, 42

[56] References Cited

U.S. PATENT DOCUMENTS

| | | | |
|---|---|---|---|
| 4,399,209 | 8/1983 | Sanders et al. ......................... | 430/138 |
| 4,440,846 | 4/1984 | Sanders et al. ......................... | 430/138 |
| 4,648,699 | 3/1987 | Holycross et al. ...................... | 396/583 |
| 4,740,809 | 4/1988 | Yamamoto et al. ..................... | 355/400 |
| 4,901,104 | 2/1990 | Sakakibara ................................ | 355/27 |
| 4,992,822 | 2/1991 | Yamamoto et al. ..................... | 355/402 |

*Primary Examiner*—D. Rutledge
*Attorney, Agent, or Firm*—Oliff & Berridge, PLC

[57] ABSTRACT

A photo and pressure sensitive printer permitting the feeding and discharging of a photosensitive recording medium at the front of the printer housing, having a compact design and slim built, which can easily be integrated into other equipment, such as a personal computer, etc., at low cost. A self-coloring microcapsule sheet supporting microcapsules is ejected from a cartridge at the front of the printer housing in the Y direction, and being preheated by a film heater to increase the sensitivity, a latent image is formed by exposure on the front face thereof while the exposure-scan is performed by a movement in the main scanning direction of a LED-type exposure head. Thereafter, an upper nip roller of a developing mechanism is moved from a separated position to a pressing position and the exposed microcapsule sheet is moved backward in the −Y direction, the capsules with low mechanical strength are ruptured by pressure and a full color image is formed on the microcapsule sheet, heat-fixing is performed by the film heater and the microcapsule sheet is discharged from the front of the printer housing.

12 Claims, 14 Drawing Sheets

IMAGE FORMING DEVICE

BACKGROUND OF THE INVENTION

The present invention relates to an image forming device, and more particularly to an image forming device used in combination with a personal computer, for coloring by pressure development, after a latent image has been formed by exposure based on image information, a photosensitive recording medium capable of forming a latent image by exposure and comprising a plurality of microcapsules, that undergo a change of strength when irradiated with light of a predetermined wavelength, encapsulating a coloring material.

Image forming systems are known according to U.S. Pat. Nos. 4,440,846 and 4,399,209 wherein a photosensitive recording medium having a photosensitive layer including microcapsules comprising photosensitive material and encapsulating a coloring material is colored by pressure development after exposure to radiation based on image information. The microcapsules, whose mechanical strength changes when exposed to light, are ruptured by means of pressure development, whereupon the coloring material and other substances encapsulated in the microcapsules flow out and development occurs. An image forming color developing material, such as a substantially colorless color former, is typically encapsulated in the microcapsules, and when the microcapsules rupture, the color former reacts as coloring material with the developer material and coloring occurs.

In the image forming systems of the patents mentioned before, by passing the exposed photosensitive recording medium between a pair of an upper and a lower nip roller during pressure development, the microcapsules that were not photocured and those that were photo-softened are ruptured, whereupon development occurs. Moreover, in U.S. Pat. No. 4,648,699 a development technique is described which, instead of the pair of nip rollers, uses a point contact ball moving relative to the photosensitive recording medium.

U.S. Pat. No. 4,740,809 further discloses an image forming device for exposure by selectively guiding a white light emitted from a white light source across a photosensitive recording medium according to a printing pattern. The U.S. Pat. No. 4,740,809 also discloses an image forming device for exposure by guiding a light from a light source for a plurality of colors across a photosensitive recording medium. And U.S. Pat. No. 4,992,822 discloses an image forming device for repeatedly exposing the same pixels in a photosensitive recording medium capable of producing a plurality of color s via a polygonal mirror, respectively.

Next, the photo and pressure sensitive printer that can be inferred from the photo and pressure type image forming devices (called "photo and pressure sensitive printer" hereafter) disclosed in the plurality of patents will be explained.

The photo and pressure sensitive printer 200 shown in FIG. 19 comprises a printer housing 201, a lightproof cartridge 203, for accommodating photosensitive recording media 202, mounted to the front of the printer housing 201 so as to be easily detachable, a feed mechanism including a feed roller 204, a transport path 206 for transporting the photosensitive recording medium in a predominantly straight line from the feed roller 204 to the discharge roller 205, transport rollers 207 and a discharge roller 205 of the transport path 206, a preheating device 208 for preheating the photosensitive recording medium 202, an exposure mechanism 209 (including guide rods 210, a carriage 211 and an exposure head 211a) for exposing, while scanning in a direction perpendicular to the surface of the drawing, the transported photosensitive recording medium 202, a developing mechanism 212 for pressure development by means of a pair of an upper and a lower nip roller 214 and 215 including a roller maintained under pressure by a spring 213, a fixing heater 216 for heat-fixing the developed photosensitive recording medium 202, a discharge tray 217 provided at the rear end of the printer housing 201, etc.

The photo and pressure sensitive printer 220 shown in FIG. 20 is designed so that sheets are both fed and discharged at the front side of the printer housing 221. The printer 220 comprises a printer housing 221, a lightproof cartridge 223, for accommodating photosensitive recording media 222, mounted to the front of the printer housing 221 so as to be easily detachable, a feed mechanism including a feed roller 224, a transport path 225, whose side elevation is predominantly in the shape of the letter "U" lying on its side, for transporting the photosensitive recording medium 222 from the feed roller 224 to the discharge roller 229, transport rollers 226 to 228 and a discharge roller 229 of the transport path 225, a preheating device 230 for preheating the photosensitive recording medium 222, an exposure mechanism 231 (including guide rods 232, a carriage 233 and an exposure head 234) for exposing, while scanning in a direction perpendicular to the surface of the drawing, the transported photosensitive recording medium 222, a developing mechanism 235 for pressure development by means of a pair of an upper and a lower nip roller 238 and 237 including a roller maintained under pressure by a spring 236, a fixing heater 239 for heat-fixing the developed photosensitive recording medium 222, a discharge tray 240 provided at the rear end of the printer housing 221, etc.

When attempting to integrate one of the photo and pressure sensitive printers into a standard-sized open front storage bay of the tower enclosure for a personal computer (e.g. the 5 inch bay: 149 mm wide, 42 mm high and 208 mm deep: 5.9×1.7×8.2 inches), the photo and pressure sensitive printer 200 shown in FIG. 19 cannot be used because of its discharge tray, which is projecting from the rear end of the printer housing. Moreover, with this printer the handling of the photosensitive recording media is made difficult, since it is supplied from the front of the printer and discharged at the rear end.

In this respect the photo and pressure sensitive printer 220 shown in FIG. 20 is more advantageous than the printer shown in FIG. 19, because the photosensitive recording media is both supplied and discharged at the front of the printer housing, however, since it is necessary to form a transport path for the photosensitive recording media in the shape of the letter "U" lying on its side, the overall height of the printer housing increases to a point where it becomes all but impossible to integrate the printer into the standard-sized storage bay of a personal computer. A further disadvantage is that the total length of the transport path for transporting the photosensitive recording media increases, which results in higher manufacturing costs because of the greater number of parts necessary for the transport mechanism.

Furthermore, the use of 2 heaters, one for preheating and the other for fixing, as in the photo and pressure sensitive printers previously described, has the disadvantage that manufacturing costs increase because of the greater number of heater parts and the added wiring.

SUMMARY OF THE INVENTION

Thus, it is the object of the present invention to enable both the supply and the discharge of the photosensitive recording media at the front side of the printer housing, reduce the total height of the printer housing, enable the integration of the printer into the storage bay of a personal computer, simplify the system for transporting the photosensitive recording media, reduce the number of necessary heaters, etc., in a photo and pressure sensitive printer.

The image forming device of one embodiment of the present invention comprises a photosensitive recording medium capable of forming a latent image by exposure to light and comprising a plurality of microcapsules, that undergo a change of strength when irradiated with light of a predetermined wavelength, encapsulating a coloring material, exposure means for forming a latent image upon exposure based on image information on the photosensitive recording medium, developing means for developing the latent image by means of the coloring material coming out of the microcapsules when pressure is applied to the photosensitive recording medium on which the latent image was formed by the exposure means, wherein the developing means comprise a pair of an upper and a lower nip roller facing each other and sandwiching the transport path of the photosensitive recording medium, pressing means for pressing one nip roller against the other nip roller, roller switching means for alternately switching between a pressing position in which the one nip roller is brought into pressure contact with the other nip roller and a separated position in which the one nip roller is separated from the other nip roller, and wherein a transport path for transporting the photosensitive recording medium comprises a feed path for feeding the photosensitive recording medium on the inlet side, a discharge path for discharging the recorded photosensitive recording medium, comprising an upstream edge near the downstream edge of the feed path, and a reversal path for transporting the photosensitive recording medium forward and backward, extending from the downstream edge of the feed path and the upstream edge of the discharge path.

The photosensitive recording medium is transported from the feed path to the reversal path, and is then transported forward along the reversal path; and while being transported forward, exposure, based on image information, takes place relative to the photosensitive recording medium by means of the exposure means. Then, after having reached the end of the forward transport of the reversal path, the photosensitive recording medium returns in reverse transport; and while in reverse transport, pressure development takes place relative to the photosensitive recording medium by means of the developing means. Following this, the photosensitive recording medium, having an image rendered visible by pressure development, is transported from the end of the reversal path to the discharge path, where it is discharged. However, it is also possible to use a constitution in which exposure takes place by means of the exposure means during reverse transport.

The facing upper and lower nip roller of the developing means sandwich the reversal path, the one nip roller being pressed toward the other nip roller by means of the pressing means, wherein the one nip roller can alternately be switched by means of the roller switching means from the pressing position, in which it is brought into pressure contact with the other nip roller, to a separated position, in which it is separated from the other nip roller. First, when the photosensitive recording medium is transported forward along the reversal path, the one nip roller, mentioned before, is retained in the separated position, and when the photosensitive recording medium is in the reverse transport of the reversal path, this nip roller is retained in the pressing position, and pressure development by means of the pair of an upper and a lower nip roller takes place relative to the exposed photosensitive recording medium.

Thus, having provided the roller switching means, it becomes possible to transport the photosensitive recording medium forward and backward along the reversal path. Moreover, having provided the reversal path, it becomes possible to shorten the total length of the transport path for transporting the photosensitive recording medium, to reduce the number of parts of the transport system and to simplify the constitution thereof. Besides, having provided the feed path and the discharge path at the front section near the front of the printer housing, a constitution for feeding and discharging at the front of the printer housing, advantageous for the handling of the photosensitive recording media, becomes possible. The reversal path can further be formed in a predominantly straight line with the feed path and the discharge path, which makes it possible to reduce the total height of the printer housing. Since the constitution described above permits the feeding and discharging of the photosensitive recording medium at the front of the printer housing, and since the total height of the printer housing can be reduced, it is possible to integrate an image forming device, designed in this way, into the storage bay of a personal computer.

In another embodiment of the image forming device according to the present invention, a heating means for heating the photosensitive recording medium is provided so as to face toward the upstream section of the reversal path during forward transport. Since this heating means is provided so as to face toward the upstream section of the reversal path during forward transport, it is possible to use the heating means for preheating the photosensitive recording medium before exposure and for heat-fixing after exposure and development. Thus, it is possible to use the heating means both for preheating and for heat-fixing, and thereby reduce the necessary wiring and the number of parts of the heating means. Otherwise, this embodiment has the same advantageous effects as the embodiment previously described.

In yet another embodiment of the image forming device according to the present invention, the heating means, developing means, and exposure means are arranged so as to face the reversal path, and so as to be lined up, one after the other, from the upstream side during forward transport. Hence, it is possible to use the heating means for preheating the photosensitive recording medium during forward transport, the exposure means for exposure during forward or reverse transport, the developing means for development during reverse transport, and having developed the photosensitive recording medium by means of the developing means during reverse transport, use the heating means for heat-fixing also during reverse transport. Otherwise, this embodiment has the same advantageous effects as the embodiment previously described.

In still another embodiment of the image forming device according to the present invention, the roller switching means comprise a drive motor and a lever-type booster mechanism for boosting and transmitting the driving force of the drive motor to the one nip roller mentioned before. Since the pressing means uses a strong pressing force for pressing the one nip roller against the other nip roller, a great force is necessary for switching the one nip roller to the separated position, however, since the roller switching means is designed so that the driving force of the drive motor is boosted and transmitted by the lever-type booster mechanism to the nip roller, it is possible to reduce the size of the drive motor. Otherwise, this embodiment has the same advantageous effects as the embodiments described before.

In a further embodiment of the image forming device according to the present invention, the roller switching means comprise a drive motor and a wedge-type booster mechanism for boosting and transmitting the driving force of the drive motor to the one nip roller mentioned before. As previously mentioned, a great force is necessary for switching the one nip roller to the separated position, however, since the roller switching means is designed so that the driving force of the drive motor is boosted and transmitted by the wedge-type booster mechanism to the nip roller, it is possible to reduce the size of the drive motor. Otherwise, this embodiment has the same advantageous effects as the embodiments described before.

In a still further embodiment of the image forming device according to the present invention, the roller switching means comprise a drive motor and an eccentric sleeve-type booster mechanism for boosting and transmitting the driving force of the drive motor to the one nip roller mentioned before. As previously mentioned, a great force is necessary for switching the one nip roller to the separated position, however, since the roller switching means is designed so that the driving force of the drive motor is boosted and transmitted by the eccentric sleeve-type booster mechanism to the nip roller, it is possible to reduce the size of the drive motor. Otherwise, this embodiment has the same advantageous effects as the embodiments described before.

BRIEF DESCRIPTION OF THE DRAWINGS

Preferred embodiments of the present invention will be described in detail with reference to the following figures, wherein.

DETAILED DESCRIPTION OF THE PREFERRED EMBODIMENTS

Preferred embodiments of the invention will be described with reference to the accompanying drawings.

The photo and pressure sensitive printer 1 related to the present embodiment is an image forming device for exposing a microcapsule sheet 2, the photosensitive recording medium, based on image information, whereupon a latent image is formed, and for developing this latent image, whereupon a color image is formed on the microcapsule sheet 2.

Figure 1:
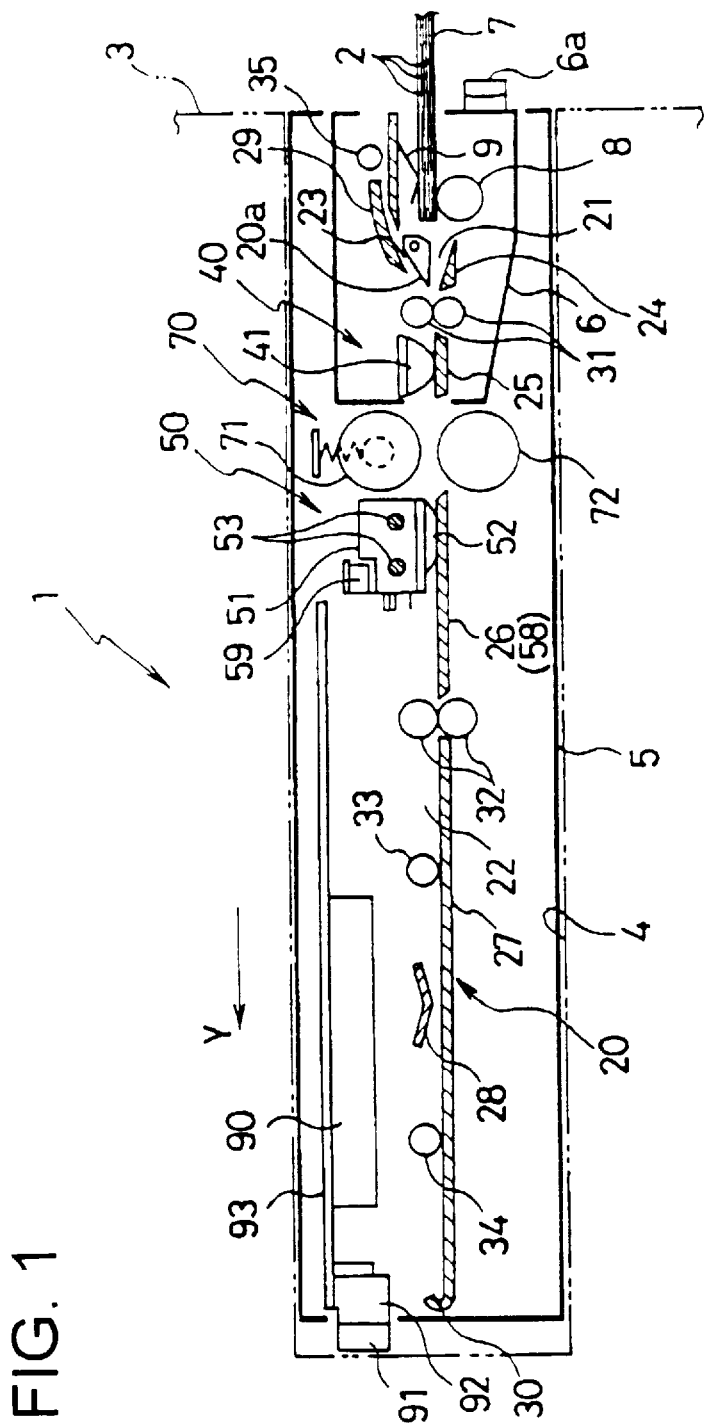
FIG. 1 is a side view in cross section showing a photo and pressure sensitive printer related to the present invention.

In the following the overall constitution of this photo and pressure sensitive printer 1 (called "printer" hereafter) will be explained. As shown in FIG. 1, the printer 1 is integrated into the tower enclosure 3 of a personal computer, wherein it is inserted, so as to be removable, in an open front storage bay 4 of the enclosure 3. This printer 1 comprises a printer housing 5, a sheet feeder housing 6, a cartridge 7 for accommodating the microcapsule sheets 2, a feeding mechanism including a feed roller 8, a transport mechanism 20 for transporting the microcapsule sheet 2, a heating mechanism 40 for preheating and for heat-fixing the microcapsule sheet 2 (called "MC sheet" hereafter), an exposure mechanism 50 including an exposure head 52, a carriage 51 and its drive system, a developing mechanism 70, a control unit 90, etc.

A connector 91 for connecting the printer to the computer is provided in the back of the storage bay 4. This connector 91 is connected to the control unit 90 via the port 92 and the circuit board 93, so that image data (RGB data, different command signals, etc.) can be supplied to the control unit 90, and different signals from the printer 1 can be supplied to the control device of the computer. The drive signals for driving the exposure head 52 are transmitted over the flexible cable 59 to the exposure head 52. By bringing the side edge of the MC sheet 2 in the transport path into contact with the side portion 10 in FIG. 2, this becomes the reference position of the transport path for MC sheets 2 with different widths.

At the printer 1, all parts inside the sheet feeder housing 6 are attached to the sheet feeder housing 6, and the sheet feeder housing 6, together with all its parts, is inserted into the printer housing 5 so as to be easily detachable, and the sheet feeder housing 6 can be removed from the printer housing 5 by turning a pair of clutch knobs 6a for latching on at the right and left side at the front of the sheet feeder housing 6. Mounted to the front of this sheet feeder housing 6 so as to be detachable, a lightproof cartridge 7 accommodates a plurality of unexposed MC sheets 2, which are piled on top of each other so that a light-transmitting support 2e of the MC sheets 2 shows upward. Further, the MC sheet 2, having come out of the cartridge 7, is preserved in an unexposed condition by the lightproof cover, etc., of the printer housing 5. Moreover, the present embodiment is applicable to MC sheets 2 of a plurality of sizes equal to or smaller than A6, however, the constitution of the MC sheet 2 will be explained later. The feed mechanism comprises a feed roller 8 for feeding the MC sheets 2, one sheet at a time, from the cartridge 7, a drive system for driving the feed roller 8, a plate spring 9 for restraining the MC sheets 2 from above.

Next, the transport mechanism 20 for transporting the MC sheet 2 will be explained.

Figure 2:
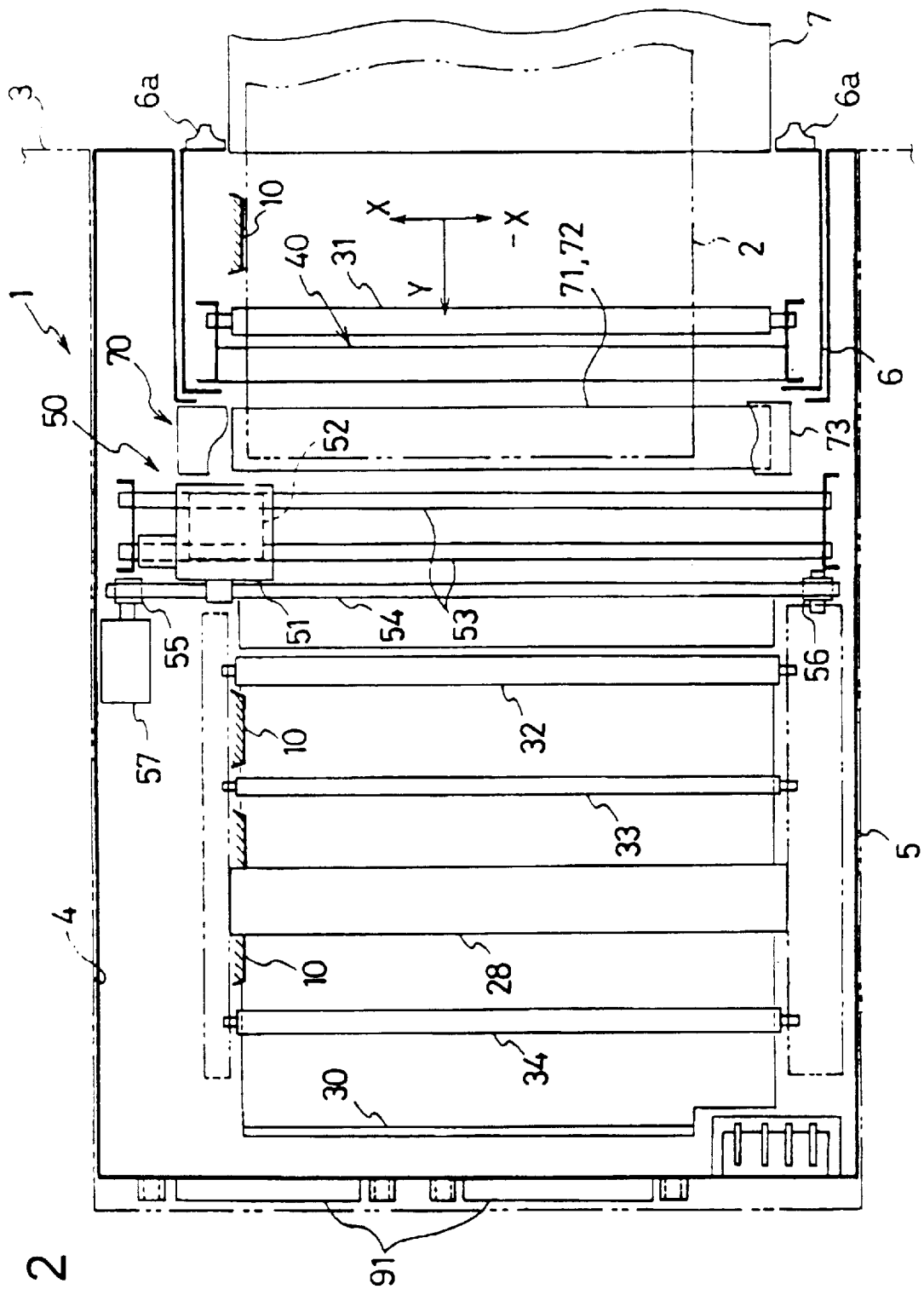
FIG. 2 is a top view in cross section of the above-mentioned printer.

As shown in FIG. 1 and 2, the transport mechanism 20 comprises a feed path 21 for transporting the fed MC sheet 2 toward the left, as seen in the drawing, a discharge path 23, situated just above the feed path 21, for discharging the MC sheet 2 on which an image has been recorded, toward the front, comprising an upstream edge near the downstream edge of the feed path 21, and a reversal path 22 extending horizontally toward the left in a straight line from the downstream edge of the feed path 21 and the upstream edge of the discharge path 23. Moreover, a wedge-shaped switching plate 20a which can be turned is provided for switching between the feed and discharge paths at the bifurcation of the feed path 21 and the discharge path 23; during feeding of the MC sheet 2, the switching plate 20a is turned upward by a solenoid actuator 106 (not shown in FIG. 1 and 2, refer instead to FIG. 12), and during discharging of the MC sheet 2, it is turned downward. Further, guide plates 24 to 29 and transport rollers 31 to 35 are provided for forming the paths 21 to 23, and at the left edge of the guide plate 27, a stopper 30 for stopping the MC sheet 2 at the end of the reversal path 22 is formed. The transport rollers 31 to 35 and the lower nip roller 72 are driven synchronously via a gear system by a stepping motor 105 (see FIG. 12) which is used for sheet transport.

Next, the heating mechanism 40 and the exposure mechanism 50 will be explained.

As shown in FIG. 1 and 2, the transport rollers 31 are provided near the left side of the switching plate 20a, and near the left side of the transport rollers 31 the film heater 41 of the heating mechanism 40 is provided close to the reversal path 22 so as to face from above toward the upstream section in forward direction. Near the left side of the sheet feeder housing 6 and near the left side of the film heater 41, the developing mechanism 70 is provided so as to sandwich the reversal path 22 from above and below, the exposure mechanism 50 is provided near the left of the developing mechanism 70, and the exposure head 52 mounted to the carriage 51 of the exposure mechanism 50 is made so that it can move back and forth in a direction perpendicular to the surface of the drawing, together with the carriage 51, while facing from above toward the reversal path 22 in close proximity thereto.

The carriage 51 while freely sliding is guided by the 2 guide rods 53 in a horizontal direction at right angles to the transport direction of the MC sheet 2, both ends of a timing belt 54, provided in parallel orientation with the guide rods 53, are linked with the carriage 51, the timing belt 54 is supported by timing pulleys 55 and 56 on both sides of the reversal path 22, and a stepping motor 57 drives the one timing pulley 55 so that the carriage 51 moves back and forth. Below the region in which the exposure head 52 of the exposure mechanism 50 is moving, combined with the guide plate 26, an exposure table 58 is provided so as to be maintained at a very small distance from the exposure head 52 and in parallel therewith; the MC sheet 2 passes between the exposure table 58 and the exposure head 52, moving back and forth, when the MC sheet 2 is transported forward in the Y direction of FIG. 1, and when the MC sheet 2 is transported backward, the exposure head 52 retreats to one side of the reversal path 22.

As shown in FIG. 1 and 2, the upper nip roller 71 (refer also to FIG. 10 and 11) is maintained in the separated position when the MC sheet 2 is transported forward, and the unexposed MC sheet 2 fed from the cartridge 7 is preheated by the film heater 41 to about 45° C. to 50° C. during forward transport to increase the sensitivity of the exposure which takes place immediately afterward. When the MC sheet 2 passes the region of the exposure mechanism 50, exposure takes place by means of the exposure head 52 scanning back and forth in a direction perpendicular to the plane of FIG. 1 (the main scanning direction), and latent images corresponding to the red, green and blue components of a color image are formed on the MC sheet 2. Then, after the MC sheet 2 has come to a halt, being stopped by the stopper 30 at the end of the reversal path 22, it is transported backwards at a predetermined speed. While the upper nip roller 71 is maintained in the pressing position, and the MC sheet 2 is pressure developed and the latent image is revealed when passing between the pair of an upper and a lower nip roller 71 and 72 of the developing mechanism 70, and passing the film heater 41, it is fixed by heating, after which the MC sheet 2 on which a color image based on image information has been recorded is discharged from the printer 1 by the transport roller 35.

The film heater 41, wherein a pattern of conductive heating elements is formed by printing or some other means on a thin film of polyimide or some other material, is made so that the film heats up when an electric current is applied to the conductive heating elements, and by heating the MC sheet 2, which has gone through pressure development, and on which a color image has appeared, to about 80° C. to 100° C., the microcapsules of the MC sheet 2 are completely hardened and the excess dye precursor inside the plurality of microcapsules is fixed and confined inside the microcapsules.

Next, the MC sheet 2 (microcapsule sheet) will be explained.

Figure 3:
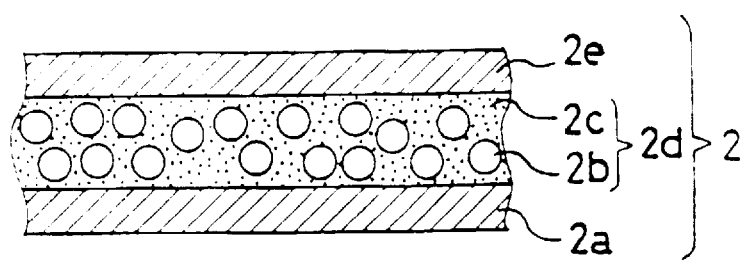
FIG. 3 is a schematic view showing a microcapsule sheet in cross section.

As shown in the cross section of the MC sheet 2 represented in FIG. 3, a mixed coating layer 2d, formed, e.g., on the surface of a white sheet support 2a, comprises a co-reactant (color developing material) 2c reacting with a dye precursor (chromogenic material) inside the microcapsules 2b, and a plurality of microcapsules encapsulating a polymerization initiator and photocurable resin that undergoes a change of mechanical strength when irradiated with light of a predetermined wavelength, wherein the plurality of microcapsules 2b encapsulates at least a dye precursor (also called "chromogenic material" below) as coloring material for coloring when brought into contact with the co-reactant (color developing material) as coloring material, while a light-transmitting support 2e is formed on top of the mixed coating layer 2d.

The plurality of microcapsules 2b comprises 3 different types of microcapsules in equal parts. The 3 types of microcapsules encapsulate the polymerization initiator and photocurable resin photocuring by irradiation with light of any one of the 3 primary colors of light, and the colorless dye precursors for producing each of the colors of yellow, magenta and cyan. For example, when irradiating the MC sheet 2 with blue light (with a wavelength of about 470 nm), the photocurable resin of the microcapsules containing only yellow dye precursors is photocured, and these microcapsules (yellow) do not rupture even when pressure developing the MC sheet 2; however the microcapsules which were not photocured (magenta and cyan) rupture and the magenta and cyan dye precursors are forced out from the microcapsules 2b and react with the color developing material 2c, whereupon coloring occurs, and these colors mix to become a blue color, whereupon this blue color can be seen through the light-transmitting support 2e.

Further, when irradiating the MC sheet 2 with green light (with a wavelength of about 525 nm), the photocurable resin of the microcapsules containing only magenta dye precursors is photocured, the yellow and cyan microcapsules are ruptured by pressure development, and as a result of the reaction of the color developing material with the yellow and cyan dye precursors the respective coloring occurs, whereupon these colors mix to become a green color. Moreover, when irradiating the MC sheet 2 with red light (with a wavelength of about 650 nm), the photocurable resin of the microcapsules containing only cyan dye precursors is photocured, the yellow and magenta microcapsules are ruptured by pressure development, and as a result of the reaction of the color developing material with the yellow and magenta dye precursors the respective coloring occurs, whereupon these colors mix to become a red color.

Furthermore, when all microcapsules are photocured by exposure to light corresponding to the 3 types of microcapsules previously mentioned, they do not rupture even by pressure development, therefore coloring does not occur, and the surface of the sheet support 2a can be seen through the light-transmitting support 2e, i.e. the sheet support 2a surface color (white in the present embodiment) becomes the background color. In short, a color image is formed only in the areas where a coloring reaction occurred when the microcapsules 2b ruptured. This coloring principal is called "self-coloring", and the surface of the light-transmitting support 2e of the MC sheet 2 is called "coloring side".

In the case of the present embodiment, resin film made of PET (polyethylene terephthalate), polyvinylchloride, etc., can be used as the light-transmitting support 2e; triphenylmethane dye and spiropyran dye can be used as chromogenic material encapsulated in the microcapsules 2b; the microcapsules 2b themselves can be made of such polymers as gelatin, polyamide, polyvinyl alcohol, polyisocyanate resin, etc.; compounds containing acryloyl groups such as trimethylolpropane triacrylate, etc., can be used as photocurable resin; and benzophenone, benzoyl alkyl ether, etc., can be used as photo-polymerization initiator.

The co-reactant 2c (color developing material) depends, among other things, on the composition of the chromogenic material inside the microcapsules 2b, however, known color developing materials such as acid substances as for example inorganic oxide such as acid clay, kaolin, zinc oxide, titanium oxide, etc., phenol novolac resin, or organic acid, etc., can be used as co-reactant 2c. In addition to the microcapsules 2b and the co-reactant 2c, a binder, a filler, a viscosity adjusting agent, etc., can further be added to the mixed coating layer 2d, which can be formed on the light-transmitting support 2e by means of a roll coater, spray coater, knife coater, etc. A transparent, translucent or opaque support such as, e.g., cellulose or synthetic paper, or resin film made of polyester, polycarbonate, etc., can be used as sheet support 2a.

Figure 4:
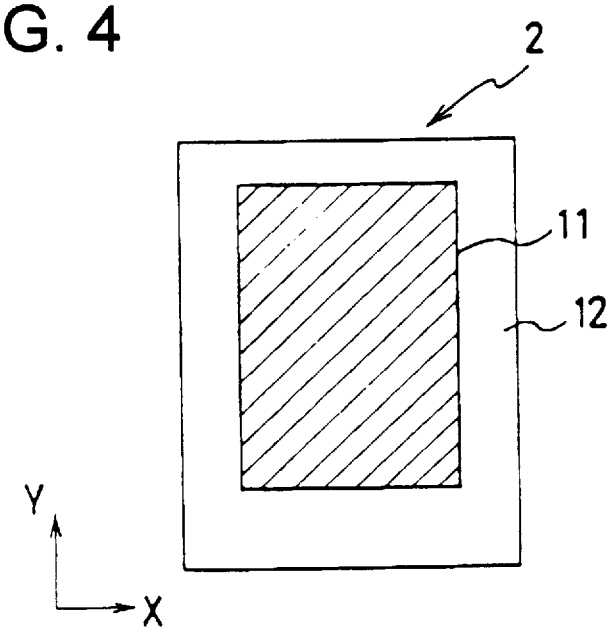
FIG. 4 is an explanatory view showing the areas of a microcapsule sheet.

Next, based on FIG. 4, the image forming area (developing area) and the peripheral area (undeveloped area) of the MC sheet 2, the constitution of which has been described above, will be explained. If in FIG. 4, which is a top plan view of the MC sheet 2, the MC sheet 2 is transported in the Y direction along the transport path of the printer 1, and if at least the exposure head 52 moves back and forth in the X direction of FIG. 4, an image forming area 11 for forming a high quality image and a peripheral area 12 surrounding the image forming area 11 are formed on the MC sheet 2. The peripheral area 12 is the area where it is not possible to form a high quality image, as in the image forming area 11, when forming an image on the MC sheet 2.

One method of forming the peripheral area 12 is to expose only the peripheral area 12 to strong white light beforehand, whereby all of the microcapsules of this area are thoroughly cured. And since the microcapsules which have been cured beforehand in this way do not rupture by pressure development, the dye precursor necessary for the image development is not released, and the peripheral area 12 becomes a white frame.

Furthermore, instead of the exposure described above, the peripheral area 12 can also be exposed beforehand to a simple pattern with a light of a predetermined wavelength. The peripheral area 12 can be pressure developed at the same time as exposing and pressure developing the desired high quality image in the image forming area 11, and the peripheral area 12 can also be developed before the desired image is exposed. Alternatively, it is also possible to form the peripheral area 12 and the image forming area 11 in the same way, and then only expose and pressure develop the image forming area 11. However, with this method the MC sheet 2 has to be handled with care because of the rupturable microcapsules remaining in the peripheral area 12 (undeveloped area). Hence, it is desirable to expose the peripheral area 12 to white light before the exposure of the desired high quality image, or after the image is formed.

Next, the exposure head 52 of the exposure mechanism 50 will be explained.

Figure 5A:
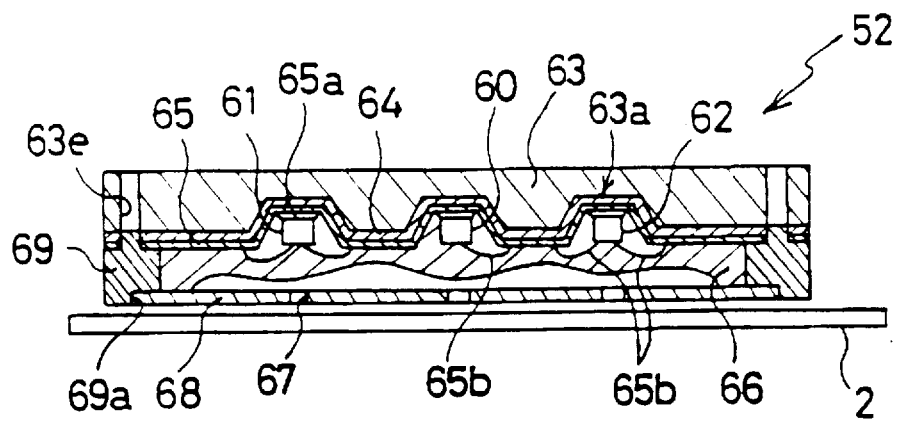
FIG. 5A is a side view in cross section showing the exposure head.
Figure 5B:
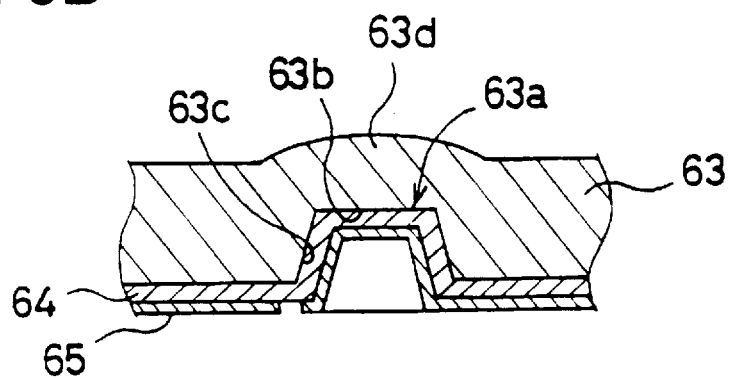
FIG. 5B is an enlarged side view in cross section showing the concave portion of the exposure head substrate.
Figure 6:
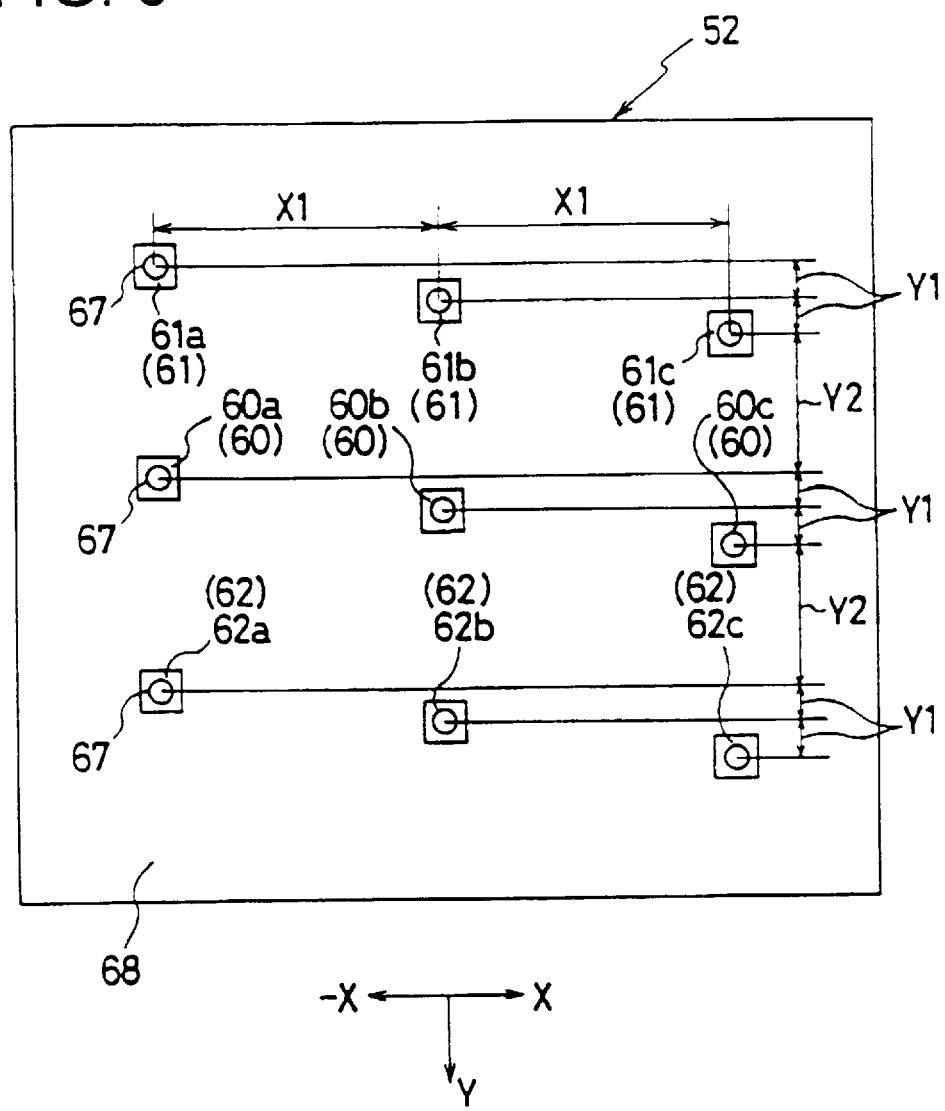
FIG. 6 is an enlarged bottom view of the exposure head.

FIG. 5A is a view in cross section of the exposure head 52 for exposing the MC sheet 2, FIG. 5B is an enlarged view also in cross section of the concave portion 63a of the exposure head 52, and FIG. 6 is a bottom view of the exposure head 52 which comprises a plurality of light emitting elements 60, 61 and 62 (9 elements in the present embodiment) and a substrate 63 for supporting these elements. In the exposure head 52, a white polyimide insulating layer 64 (with about 100 $\mu$m thickness) is formed on the surface of the flat aluminum substrate 63, and an electrode layer 65 for transmitting electrical signals is formed with a predetermined land pattern, in plan view, by printing on the surface of the insulating layer 64. The electrode layer 65 is made from a 35 $\mu$m copper layer, a 5 $\mu$m nickel layer and a 0.5–1.0 $\mu$m gold layer. In this way, the required number of concave portions 63a is formed in the substrate 63 so as to correspond to the predetermined places of the electrode layer 65 formed in accordance with a predetermined pattern, and in each of the concave portions 63a LEDs 60 to 62 are mounted as light emitting elements.

Which means that, as shown in FIG. 5B, in cross section, a cone-shaped concave portion 63a is formed by precision pressing of the substrate 63 by a known fine blanking method using a predetermined die (not shown in the drawing) in which a concave part has been formed which corresponds to the protrusion corresponding to each concave portion 63a and to the convex portion 63d as material recess at the underside of the concave portion 63a. In this embodiment, the ceiling 63b of each concave portion 63a is formed in parallel with the surface of the substrate 63, and the side faces 63c of each concave portion 63a are inclined from the ceiling 63b so as to widen toward the bottom. The insulating layer 64 on the surface of the substrate 63 and the electrode layer 65 are also formed in accordance with a predetermined pattern along the surface of the concave portion 63a, and the depth of each concave portion 63a is formed so as to be greater than the mounting height of the LEDs 60 to 62.

Further, the red LED 60, green LED 61 and blue LED 62 are respectively provided at the surface of the electrode layer 65 at the ceiling 63b of the concave portion 63a and fixed by a conductive adhesive 65a. And since here the depth of the concave portion 63a is a little greater than the mounting height of the LEDs 60 to 62, the underside of the LEDs 60 to 62 does not protrude beyond the surface of the substrate 63. From the underside of the red LED 60, the green LED 61 and the blue LED 62 an electrical connection is made by a bonding wire 65b at predetermined positions of the land patterned electrode layer 65; these LEDs and the bonding wire 65b are sealed by a transparent sealing material 66 so as not to come into contact with air.

As adhesive 65a, silver paste is used for the red LED 60 and epoxy resin, etc., is used for the green LED 61 and blue LED 62. This is because, contrary to the red LED 60 whose upper face forms one of the electrical terminals and for which it is therefore necessary to use a conductive adhesive to make contact with the substrate 65, the terminals for the green LED 61 and the blue LED 62 are both situated at their respective lower faces, for which reason they are glued on with an insulating transparent epoxy resin. Because of using a transparent adhesive 65a, the emitted light, generated inside the green LED 61 and the blue LED 62, which radiates toward the ceiling 63b, passes through the transparent adhesive 65a and being reflected by the ceiling 63b is again emitted, this time toward the bottom, with the effect that the strength of the emitted light is increased.

A material based on AlGaAs and the known high output DDH structure can be used for the red LED 60. The center wavelength of the emitted light of the red LED 60 is about 650 nm. 1 electrical terminal is at the upper face and 1 electrical terminal is at the lower face. For the green LED 61 and the blue LED 62 a material based on GaN can be used. The center wavelength of the emitted light is 525 nm and 470 nm respectively. The green LED 61 and the blue LED 62 have 2 electrical terminals each at the lower face and no terminal at the upper face. By passing an electric current in a predetermined direction through those 2 terminals of each LED, the emitted light radiates in all directions, and a portion thereof radiates directly toward the bottom, in the drawing, another portion is first reflected at the side faces 63c of the concave portion 63a and is then radiated toward the bottom in the same manner.

The bonding wire 65b, made from gold wire, is bonded by means of heat and ultrasonic waves to the top face of each LED and to the electrode layer 65. The sealing material 66 is made from thermosetting resin (e.g., transparent silicon resin, JCR, etc.). Thermosetting typically takes place in about 1 hour at 150° C. When generic semiconductor elements such as LEDs, etc., come into contact with air, their surface oxidizes, and by the effect of moisture absorption, etc., their properties deteriorate; therefore the sealing material 66 has the function to prevent this deterioration and to protect the bonding wire 65b, etc., from mechanical shock.

At the underside of the substrate 63, a mask 68 having a plurality of pin holes 67 is provided, and positioned by means of a mask support 69. The mask support 69 is fixed by insertion into the fitting holes 63e of the substrate 63 used for positioning, and the mask 68 is fitted into a positioning groove 69a, formed at the underside of the mask support 69 for supporting the mask 68, and can be fixed by adhesives, screws, etc., in a solid connection with the substrate 63. In the present embodiment, the mask 68 is solidly connected to the substrate 63 by means of the sealing material 66.

The mask support 69 is a molded product made from a high precision heat resistant plastic material, and using the fitting holes 63e for positioning of the substrate 63 as reference, the mask 68 is positioned in 3 directions. When positioning and bonding the mask support 69 and the mask 68 at the same time with thermosetting resin as sealing material 66, it is necessary to use heat resistant material for the mask support 69, so that it is not deformed by the setting temperature of the sealing material 66.

The mask 68 is made as a thin stainless steel sheet with a thickness of about 0.1 mm, its external shape and the pin holes 67 are formed by an etching process, and its surface is blackened by means of a dipping method so as not to reflect light. The pin holes 67 have a diameter of 0.18–0.25 mm (about 0.007–0.010 inch). This diameter determines the resolution of the light pattern supplied to the MC sheet 2. The plurality of pin holes 67 is formed so as to be opposite the top face of the red LED 60, the green LED 61 and the blue LED 62, respectively.

Here, a plurality of LEDs form 1 set of LEDs' 60a to 60c for red, 1 set of LEDs 61a to 61c for green, and 1 set of LEDs 62a to 62c for blue, and the relation between the positions of these LEDs is shown in FIG. 6, wherein the distance X1 in the direction of the back and forth movement of the exposure head 52 (the ± X direction in FIG. 6) is an integer multiple of 1 pixel (1 dot) of the image formed on the MC sheet 2 (e.g., X1 is a length of 16 dots), and the distances Y1 and Y2 in the transport direction (the Y direction in FIG. 6) of the forward transport of the MC sheet 2 are integer multiples of 1 pixel (e.g., Y1 is a length of 1 dot and Y2 is a length of 10 dots). With a length of 12 dots, (2 Y1+Y2) is set to an integer multiple of the number of installed LEDs for each color (3). Furthermore, the relation between the positions of the pin holes 67 formed in the mask 68 is identical to that of the LEDs 60 to 62 mentioned above.

During exposure, the exposure head 52 is moved back and forth at a predetermined speed in the ± X direction in FIG. 6, while the MC sheet 2 is transported forward in the Y direction also in FIG. 6 (the direction toward the left in FIG. 1 and 2), and the surface of the MC sheet 2 and the mask 68 are kept close to each other. In this way, by the scanning movement, each set of LEDs, 60 to 62, selected based on image information, is independently driven by modulation; and by supplying a light of a predetermined center wavelength at a predetermined light energy for a predetermined amount of time to each pixel, a latent image of a color image is formed on the MC sheet 2.

Next, the exposure process for forming a latent image by the back and forth scanning movement of the exposure head 52, while the MC sheet 2 is transported, will be explained in detail.

As shown in FIG. 1 and 2, the MC sheet 2 is exposed on its surface side (the side of the light-transmitting support 2e) by the exposure head 52. The exposure head 52, which comprises the mask 68 with the pin holes 67, the mask support 69 and the substrate 63, is mounted on the carriage 51, which is fitted so that it can move back and forth along the guide rods 53 which are at right angles to the transport direction of the MC sheet 2, and is moved back and forth by a drive system, which includes the stepping motor 57, so as to cover the entire width of the image forming area 11 of the MC sheet 2.

Figure 7:
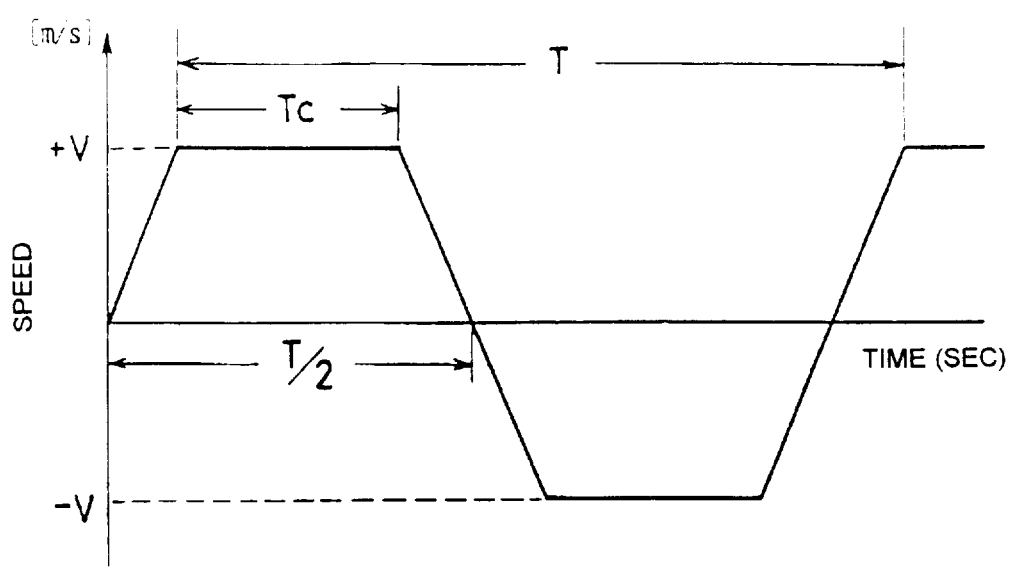
FIG. 7 is a diagram of the scanning speed and other characteristics of the exposure head.

FIG. 7 is a diagram showing the variations in time of the scanning speed of the carriage 51, which, having a maximum speed V (m/sec), a scan cycle T (sec) and a constant speed duration Tc (sec), is driven back and forth in a trapeze-shaped pattern of speed variations. As shown in FIG. 7, the carriage 51 is moved back and forth in the ± X direction of FIG. 2 at a maximum constant scanning speed ± V (m/sec). The inclined portion on the time axis in FIG. 7 represents the acceleration and deceleration between the maximum constant scanning speed ± V and a momentary halt at the end of the back and forth movement. Moreover, the duration Tc is the time required for the carriage 51 to pass the distance of the width (in the ± X direction) of the image forming area 11 at the maximum constant scanning speed, and the duration T is the scan cycle.

While the MC sheet 2 is transported in the Y direction of FIG. 6 and the exposure head 52 scans back and forth in the ± X direction of FIG. 6, each exposure line (1 dot line along the ± X direction of FIG. 2) of the MC sheet 2 is exposed, first by the green LED 61, next, after the MC sheet 2 has been transported by an amount of 12 pixels, by the red LED 60, and next, after the MC sheet 2 has again been transported by an amount of 12 pixels, by the blue LED 62. And then, when exposing each pixel of each exposure line by the green LED 61, the same pixel is exposed 3 times by the 3 LEDs 61a to 61c. Exposure by the red LEDs 60a to 60c and exposure by the blue LEDs 62a to 62c takes place in the same way.

Figure 8:
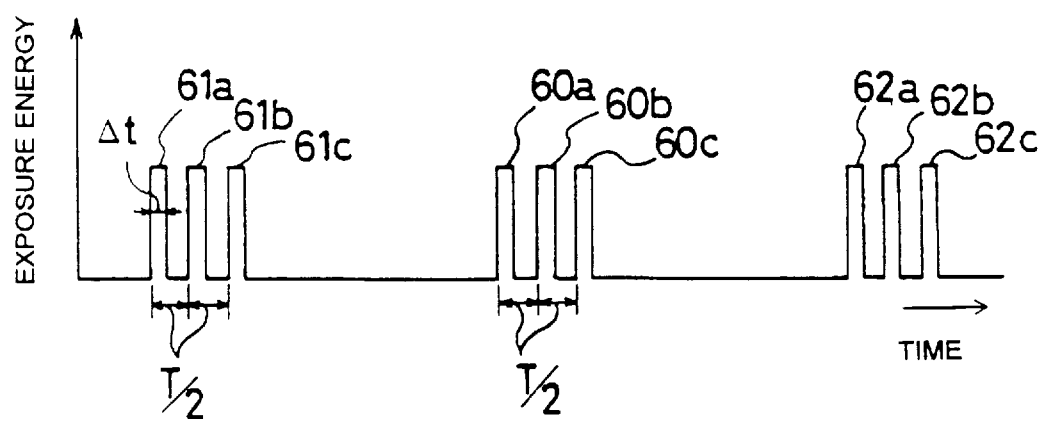
FIG. 8 is a time chart of the exposure of one and the same pixel.

Next, this will be explained concretely while focusing on 1 pixel of the MC sheet 2; when, for example, coloring this 1 pixel white, it is illuminated by green, red and blue light. First, during exposure by the green LEDs 61, the carriage 51 is moved in the forward direction (e.g., the − X direction), and when the pin hole 67 corresponding to the green LED 61a is positioned over the pixel, the green LED 61a is switched on 1 time for a predetermined short duration Δt only, next, the carriage 51 is stopped once at the end of the forward movement, and after the MC sheet 2 has been transported in the Y direction of FIG. 6 by an amount of 1 dot only, the carriage 51 is moved in the backward direction (e.g., the + X direction), and when the pin hole 67 corresponding to the green LED 61b is positioned over the pixel, the green LED 61b is switched on 1 time for a predetermined short duration Δt only, next, the carriage 51 is stopped once at the end of the backward movement, and after the MC sheet 2 has been transported in the Y direction of FIG. 6 by an amount of 1 dot only, the carriage 51 is moved in the forward direction and when the pin hole 67 corresponding to the green LED 61c is positioned over the pixel, the green LED 61c is switched on 1 time for a predetermined short duration Δt only, after which the carriage 51 is stopped once at the end of the forward movement. In this way, as shown in FIG. 8, at each half duration of the scan cycle T, a green LED is switched on in the order 61a, 61b, and 61c over 1 pixel for a short duration Δt each.

Next, after the MC sheet 2 has been transported by an amount of 12 pixels (12 dots) only in the Y direction, exposure by the red LEDs 60 takes place 3 times by the red LEDs 60a, 60b, and 60c, one after the other, in the same way as described before and then, after the MC sheet 2 has again been transported by an amount of 12 pixels only in the Y direction, exposure by the blue LEDs 62 takes place 3 times by the blue LEDs 62a, 62b, and 62c, one after the other, in the same way as described before. By the above method, as shown in FIG. 8, exposure of the 1 pixel takes place 3 times for each of the 3 colors. As a result, the microcapsules for the 3 colors of this 1 pixel are photocured and coloring does not occur, whereupon the pixel takes on the white color of the sheet support 2a background.

Figure 9:
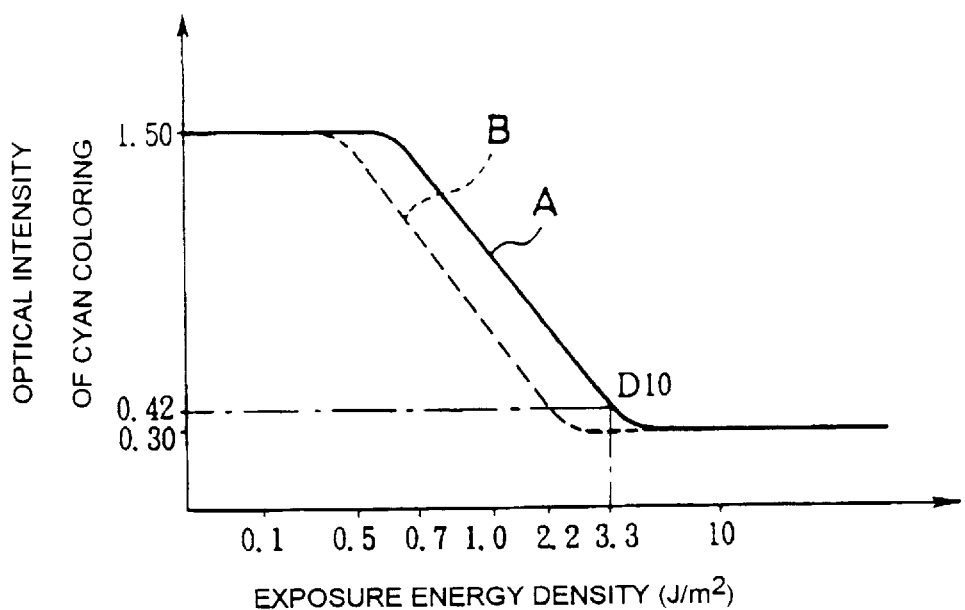
FIG. 9 is a curve showing the characteristics of the exposure energy density corresponding to the optical intensity of cyan coloring.

Thus, since the exposure of the same pixel of the MC sheet 2 takes place 3 times for each color within a time interval of half the scan cycle T, it is possible to increase the sensitivity of the coloring and to change the luminous intensity of the coloring at a low luminous radiant energy density. In FIG. 9, the optical intensity of the cyan coloring is plotted along the vertical axis and the total amount of the exposure energy density ($J/m^2$) is plotted along the horizontal axis. The full line A shows the variations of the optical intensity of the cyan coloring when the red LED 60 emits light only 1 time, and the dotted line B shows the variations of the optical intensity of the cyan coloring when the emission of the red LED 60 is divided into 3 times separated by a time interval of half the scan cycle T.

In FIG. 9, to obtain a cyan coloring with an optical intensity of 10%, i.e. D=0.42, an exposure energy density of 3.3 $J/m^2$ emitted at 1 time is necessary, however, when dividing the emission into 3 times, as described before, a total exposure energy density of 2.2 $J/m^2$ is sufficient. It is clear from FIG. 9 that to obtain the same optical intensity of the cyan coloring, in the range of exposure energy densities from 0.5 to 3.3 $J/m^2$, a low exposure energy density is sufficient when dividing the emission of light into 3 times, whereas a high exposure energy density is required when emitting only 1 time.

The reason for this is that, since the speed of the polymerization reaction which occurs during irradiation by light between the polymerization initiator and the photocurable resin of the microcapsules 2b of the MC sheet 2 is not very high, for accelerating the reaction process it is better to apply the exposure energy divided into a plurality of times (e.g., 2 to 6 times) a little at a time with suitable time intervals, rather than to apply a great amount of exposure energy 1 time. In other words, even when reducing the output power of each LED, or when the number of installed LEDs is small, it is still possible to obtain a sufficient degree of optical intensity of the coloring.

Furthermore, it is desirable that exposure and development of the MC sheet 2, at least in the image forming area 11 thereof, take place at a constant speed. Therefore, the displacement distance L (m) at a constant speed corresponding to the shortest constant speed duration Tc required for exposing and developing the MC sheet 2 is at least so that all pin holes 67 pass the image forming area 11. This constant speed displacement distance L (m) can be chosen at will, taking into consideration the image forming area 11, the alignment pattern of the pin hole 67 and the maximum speed V (m/sec). For example, with L=0.1118 m and V=0.86 m/sec it is possible to expose the whole surface of an A6 size MC sheet 2.

Next, the developing mechanism 70 will be explained.

Figure 10:
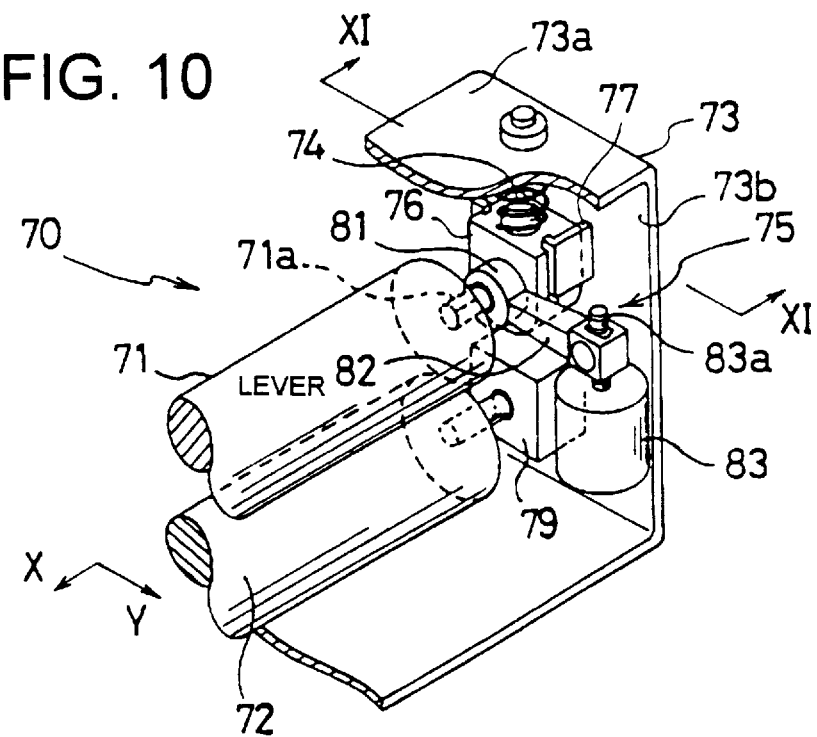
FIG. 10 is a perspective view showing the essential parts of a developing mechanism.
Figure 11:
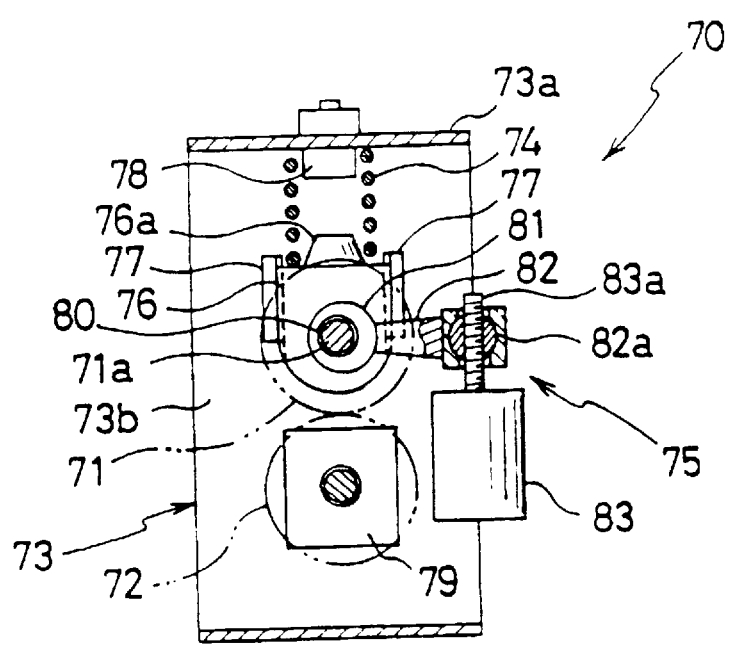
FIG. 11 is a view in cross section taken along line XI—XI of FIG. 10.

As shown in FIG. 1, 10 and 11, the developing mechanism 70 comprises a pair of an upper and a lower nip roller 71 and 72, a rectangular frame 73, fixed inside the printer housing 5, for supporting the nip rollers 71 and 72, a pair of compression springs 74 for pressing both ends of the roller axis 71a of the upper nip roller 71 toward the lower nip roller 72, and a roller switching mechanism 75 for alternately switching between a pressing position in which the upper nip roller 71 is brought into pressure contact with the lower nip roller 72 and a separated position in which it is separated from the lower nip roller 72. If, e.g., the pressing force of each of the springs 74 is 150 kgf, the upper nip roller 71 presses with a total force of 300 kgf on the lower nip roller 72.

Each end of the roller axis 71a of the upper nip roller 71 is supported by a bearing block 76 so that it can rotate freely, each bearing block 76 is guided by a pair of guide members 77, fixed to the frame 73, so that it can move freely up and down, and between each bearing block 76 and the upper wall 73a of the frame 73 a spring 74 is press-fitted. The lower end of the spring 74 is forced into place by the convex portion 76a on the top face of the bearing block 76, and the upper end of the spring 74 is forced into place by a protrusion 78 fixed to the upper wall 73a.

Each end of the roller axis of the lower nip roller 72 is supported by a bearing member 79 so that it can rotate freely, and each bearing member 79 is fixed to the vertical wall 73b of the frame 73. Further, the lower nip roller 72, being the driver-side roller, doubles as transport roller, and is linked to the gear system driving the transport mechanism 20 so as to transmit movement for driving in the forward direction during forward transport of the MC sheet 2, and to transmit movement for driving in the backward direction during reverse transport of the MC sheet 2.

When explaining the roller switching mechanism 75, even though a roller switching mechanism 75 is provided on each side in the axis direction of the upper nip roller 71, only the constitution of one side will be explained, since their constitution is symmetrical. At the bearing block 76, a ring-shaped bearing 80 for receiving and supporting the roller axis 71a so that it can rotate freely and an eccentric sleeve 81 slid over the outside of the bearing 80 are provided, wherein the eccentric sleeve 81 is fitted to the bearing blocks 76 so that it can rotate freely. At the head of the lever 82, extending in the Y direction from the eccentric sleeve 81, a threaded nut 82a is provided so that it can move freely around an axis center in the ± X direction, and a threaded portion 83a formed on the vertical output axis of the electric motor 83 extends through and engages the threaded nut 82a, and when rotating the lever 82 by a predetermined angle toward the bottom by running the electric motor 83 for a predetermined very short period of time, the bearing block 76 is moved to the top by about 1 mm by the decentering action of the eccentric sleeve 81, and the upper nip roller 71 is switched to the separated position in which it is separated from the lower nip roller 72 by about 1 mm. When running the electric motor 83 in the opposite direction for a period of time identical to the one mentioned above in this separated position, the upper nip roller 71 descends and is switched to the pressing position in which it is brought into pressure contact with the lower nip roller 72.

When the MC sheet 2 is transported forward in the Y direction, the upper nip roller 71 is maintained in the separated position, and when developing the MC sheet 2 during reverse transport, the upper nip roller 71 is maintained in the pressing position. Moreover, the motor 83 is fixed to the vertical wall 73b of the frame 73. And since the developing mechanism 70 uses a booster mechanism, including the eccentric sleeve 81, to boost and transmit the driving force of the motor 83 to the bearing block 76, it is possible to reduce the size of the motor 83. Furthermore, it is also possible to guide the bearing block 76 freely up and down by guide rods, or by a guide member provided at the vertical wall 73b of the frame 73, or to use a solenoid actuator, instead of the motor 83, to drive the lever 82.

Next the control unit 90 of the printer 1 will be explained.

Figure 12:
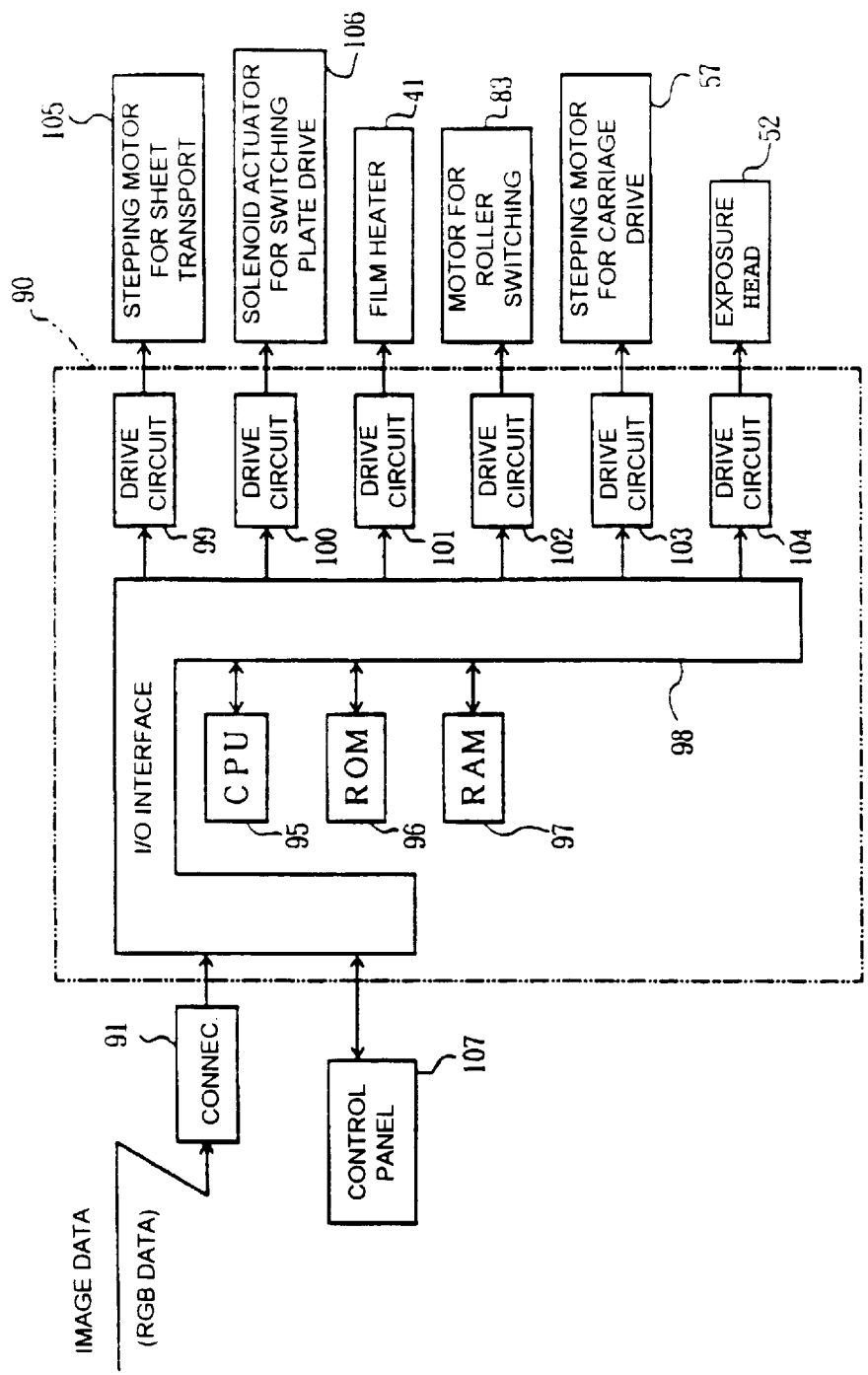
FIG. 12 is a block diagram showing the control system of a photo and pressure sensitive printer.

As shown in FIG. 12, the control unit 90 comprises a computer comprising a CPU 95, a ROM 96 and a RAM 97, an I/O interface 98, and drive circuits 99 to 104, wherein a stepping motor 105 for paper transport, a solenoid actuator 106 for driving the switching plate, a film heater 41, a motor 83 for roller switching, a stepping motor 57 for driving the carriage, the exposure head 52, etc., are respectively connected to the drive circuits 99 to 104. A connector 91 and a control panel 107 are also connected to the control unit 90, and image data (RGB image data) from an external host computer are fed via the connector 91 to the control unit 90.

The ROM 96 stores control programs for controlling all operations of the printer 1, a control program for calculating, from the input image data, the duration for which each LED of the exposure head 52 is turned on and the timing thereof, a control program for controlling the transport of the MC sheet 2 by controlling the stepping motor 105 for sheet transport synchronously with the exposure to green, red and blue light, a control program for controlling the scanning of the exposure head 52 by controlling the stepping motor 57 for driving the carriage synchronously with the exposure to green, red and blue light, etc.

The different buffers and memory types necessary for running the control programs are in the RAM 97, and the number of copies to be printed, the enlargement or reduction ratio of the image, the size of the image forming area 11 of the MC sheet 2, etc., input by an operator at the control panel 107, are stored in the memory of the RAM 97. Exposure takes place upon calculation of the driving conditions for the stepping motor 57, driving the carriage, based on the data of the size of the image forming area 11.

When image data of an image is sent to the control unit 90, this image data is divided into R image data, G image data, and B image data and stored in a buffer of the RAM 97. Each LED of the exposure head 52 is electrically driven by the drive circuit 104 via the flexible cable 59.

Figure 13:
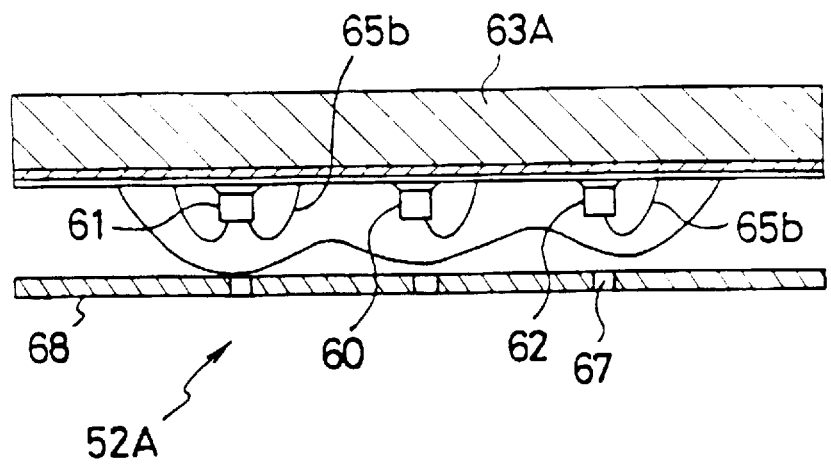
FIG. 13 is a side view showing a prior art exposure head in cross section.

Next, the light utilization efficiency of the exposure head 52 will be explained with the help of a numerical example. FIG. 13 shows the typical structure of the exposure head 52A of a conventional printer in cross section, different from the exposure head 52, in that there are no concave portions in the substrate 63A, and in that the LEDs 60 to 62 are mounted to the surface of the substrate 63A. The light energy output from the red LED 60, when driven by an electrical current of 20 mA at normal temperature, is 2 mW for all light beams. Further, the chip size of the red LED 60 is a square of 0.3 mm by 0.2 mm height (about 0.0118× 0.0118×0.0079 inch). For a red LED 60 mounted to the flat substrate 63A, as shown in FIG. 13, the light energy emitted from the pin hole 67 of the mask 68 at a distance of 1 mm (0.039 inch) from the top face of the chip is, at identical driving conditions, 64 µW, which represents a light utilization efficiency of 3.2%. The light utilization efficiency of the green LED 61 and the blue LED 62 is almost identical.

By comparison, with a substrate comprising the concave portion 63a as in FIG. 5, the light energy emitted from the pin hole 67 of the mask 68 at a distance of 1 mm (0.039 inch) from the top face of the chip is, at identical conditions, 120 µW; thus, almost doubling the light utilization efficiency to 6.0%. Substantially the same advantageous effect is obtained with the green LED 61 and the blue LED 62. This light utilization efficiency can be further increased by reducing the coarseness of the side faces 63c and by giving the shape of a reflecting mirror with a free curved surface thereto.

Next, the stray light not used for the image formation will be explained.

Since all the LEDs are mounted to the surface of the flat substrate 63A in the exposure head 52A without concave portion, as shown in FIG. 13, the light emitted by the red LED 60 in horizontal direction is directly projected onto the green LED 61 and the bonding wire 65b connecting the green LED 61 and reflected therefrom, and then being emitted from the pin hole 67, from which the green light ought to be emitted, results in the so-called problem of stray light, whereby the image quality of the color image deteriorates significantly. By comparison, when using an exposure head 52 like the one shown in FIG. 5, the light emitted from the red LED 60 is not directly projected onto the green LED 61 because of the side faces 63c of the concave portion 63a, and the light that is not directly emitted through the pin hole 67 is absorbed by the back of the mask 68 because of a non-reflection treatment that has been applied to the back of the mask 68, whereby the image quality is significantly improved.

Regarding the adhesive height and the length of the bonding wire 65b, when performing the bonding process of the exposure head 52 of the present embodiment with a wire bonder (bonding robot), the operation of the bonding robot can be simplified, and other advantageous effects can be achieved, because the length of the bonding wire 65b is reduced, and the bonding positions are predominantly at the same height. Further, for improving the light utilization efficiency it is advantageous to dimension the concave portions 63a in FIG. 5 so small that each of the LED chips will just fit into them, and because of this it is also advantageous to position the bonding pads (the connecting positions of the wire 65b) in the land patterned electrode layer 65 in places other than the concave portions 63a. This is also advantageous in cases where it is difficult to form the land pattern of the electrodes on the ceiling 63b or side faces 63c of the concave portion 63a, when it is necessary to form small and relatively deep concave portions 63a.

Coming now to the required energy density for the photosensitive recording material, the energy density necessary for photocuring the microcapsules 2b of the MC sheet 2 is about 3 $J/m^2$, which is about 300 times of what is required for silver salt photographs with a sensitivity of 0.1 $J/m^2$. Thus, compared with the energy applied to the sensitive material in typical photography, etc., the energy required for the exposure of the MC sheet 2 is very high. For implementing the exposure of the MC sheet 2 with the printer 1 of the present embodiment, according to a simple calculation using a write cycle of 100%, 42 of the red LEDs 60 are required to expose 1 $m^2$ in 600 seconds, since the energy that can be supplied by 1 red LED 60 is 120 $\mu$W. Compared to this, with the exposure head 52A without a concave portion, as in FIG. 13, twice as many, i.e. 84 red LEDs 60 are necessary.

Next, the development process for developing the latent image, formed on the MC sheet 2 by means of the developing mechanism 70, will be explained. When exposing the MC sheet 2 while it is transported in the transport direction of the forward transport and the upper nip roller 71 is maintained in the separated position, the MC sheet 2 moves intermittently 1 dot at a time in the transport direction of the forward transport, however, when pressure developing the MC sheet 2 by means of the developing mechanism 70 while it is moved in the transport direction of the reverse transport and the upper nip roller 71 is maintained in the pressing position, the MC sheet 2 moves continuously at a predetermined constant speed. When exposing the microcapsules 2b of the MC sheet 2, they are photocured; however, the strength of the unexposed microcapsules 2b remains very low, and since the MC sheet 2 is pressed with great force when passing between the upper and lower roller 71 and 72 during development, only the unexposed microcapsules 2b are ruptured, and the dye precursor flowing out from inside the microcapsules 2b reacts with the color developing material 2c, whereupon coloring occurs.

In the above described printer 1, by providing the roller switching mechanism 75 for switching the one nip roller 71 alternately between the separated position and the pressing position, it becomes possible to transport the MC sheet 2 backward and forward along the reversal path 22. And by providing the reversal path 22, it becomes possible to shorten the total length of the transport path for transporting the MC sheet 2, to reduce the number of parts of the transport system and to simplify the constitution thereof. And by providing the feed path 21 and the discharge path 23 at the front section near the front of the printer housing 5, a constitution for feeding and discharging at the front of the printer housing 5, advantageous for the handling of the MC sheet 2, becomes possible. And since the reversal path 22 is formed in a predominantly straight line with the feed path 21 and the discharge path 23, it becomes possible to reduce the total height of the printer housing 5, and to integrate it into the storage bay 4 of a personal computer.

Further, since the heating mechanism 40 for heating the MC sheet 2 is provided so as to face toward the upstream section of the reversal path 22 during forward transport, it is possible to use it for preheating the MC sheet 2 before exposure and for heat-fixing after exposure and development. Thus, it is possible to use the heating mechanism 40 both for preheating and for heat-fixing, and to thereby reduce the necessary wiring and the number of parts of the heating mechanism 40.

Furthermore, the heating mechanism 40, developing mechanism 70, and exposure mechanism 50 are arranged so as to face the reversal path 22, and so as to be lined up, one after the other, from the upstream side during forward transport; hence, it is possible, during forward transport of the MC sheet 2, to use the heating mechanism 40 for preheating the MC sheet 2, after which the exposure mechanism 50 is used for exposure, and the developing mechanism 70 for developing the MC sheet 2 during reverse transport, after which the heating mechanism 40 is used for heat-fixing.

Next, partial modifications of the embodiments will be explained.

1) The MC sheet 2 used as photosensitive recording medium is not limited to what has been described before, but different variations thereof are possible. Instead of encapsulating the photocurable resin and the polymerization initiator inside the microcapsules of the MC sheet 2, the photocurable resin and the polymerization initiator can also be included in the material constituting the microcapsules of the MC sheet 2.

Further, instead of photocurable microcapsules, the MC sheet 2 can also contain photo-softening microcapsules. For example, microcapsules which have sufficient strength in the unexposed state, and which soften when exposed to light of a predetermined wavelength. In this case it is desirable to perform thermal-curing by heat-fixing.

Apart from the self-coloring type MC sheet 2 described above, a transfer type sheet can also be adopted. With this method, a transparent support sheet for supporting the microcapsules is integrated with an image receiving paper by superposing the face of the support sheet comprising the microcapsules with the face of the image receiving paper comprising the color developing material so that it can be peeled off; and feeding the support sheet from a cartridge to the exposure head, it is exposed and developed in the integrated state, and then, after being discharged from the device, the image receiving paper is peeled off. The dye precursor that flows out of the microcapsules ruptured by pressure is transferred to, and reacts with the color developing mate rial of the image receiving paper, whereupon coloring occurs and an image is produced.

Further, instead of the dye precursor, it is also possible to encapsulate the photosensitive material together with coloring materials and pigments that have been colored beforehand. In that case, a transfer type image forming method becomes possible, wherein the support sheet is integrated with image receiving paper without color developing material (i.e., normal paper) so that it can be peeled off. And when peeling off the image receiving paper, an image is produced thereon.

Moreover, apart from microcapsule sheets, photosensitive recording media such as silver salt film, diazo type photosensitive paper, etc., that form a color image when undergoing exposure by irradiation and development, can also be used.

2) There is no need to use red, green and blue light emitting elements; depending on the characteristics of the photosensitive recording medium, light emitting elements with various wavelengths can be selected. For example, light emitting elements emitting infrared light, red, and green, or light emitting elements emitting far infrared light, near infrared light, and red can also be selected. Ultraviolet and far ultraviolet are also advantageous examples of valid color choices for light emitting elements. Moreover, the number of colors of the light emitting elements is not limited to the 3 colors red, green, and blue; it is equally possible to use only 1 or 2 colors, or to select 4 colors, as in a typical color printer using yellow, magenta, cyan, and black, or even more colors. Furthermore, the choice of light emitting elements is not limited to LEDs; other light emitting elements such as electroluminescent lamps (EL), light emitting plasma and laser devices, etc., can also be used.

Figure 14:
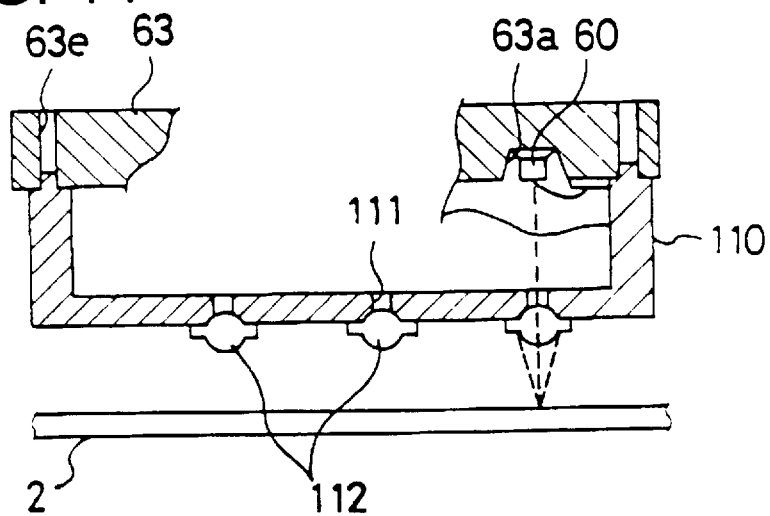
FIG. 14 is a side view showing a modified embodiment of the exposure head in cross section.

3) As shown in FIG. 14, it is possible to use an optical imaging system of a single plastic lens, etc. The light passing aperture 111 is formed in the support member 110 inserted in the positioning holes 63e of the substrate 63 so as to face the concave portion 63a of the substrate 63, the single plastic lens 112 is mounted on the lens mount formed at the periphery of the light passing apertures 111, and the MC sheet 2 is provided at the focus position of the lens 112. In this way, when using a lens system together with the effect of the concave portion 63a, the light energy supplied to the MC sheet 2 is increased and the light utilization efficiency is improved because the incident light energy at the lens 112 is amplified.

4) Instead of the roller switching mechanism 75 the roller switching mechanism described below can be used. The same reference numerals in FIG. 10 and 11 denote the same parts as in the present embodiment, and a detailed explanation thereof will be omitted.

Figure 15:
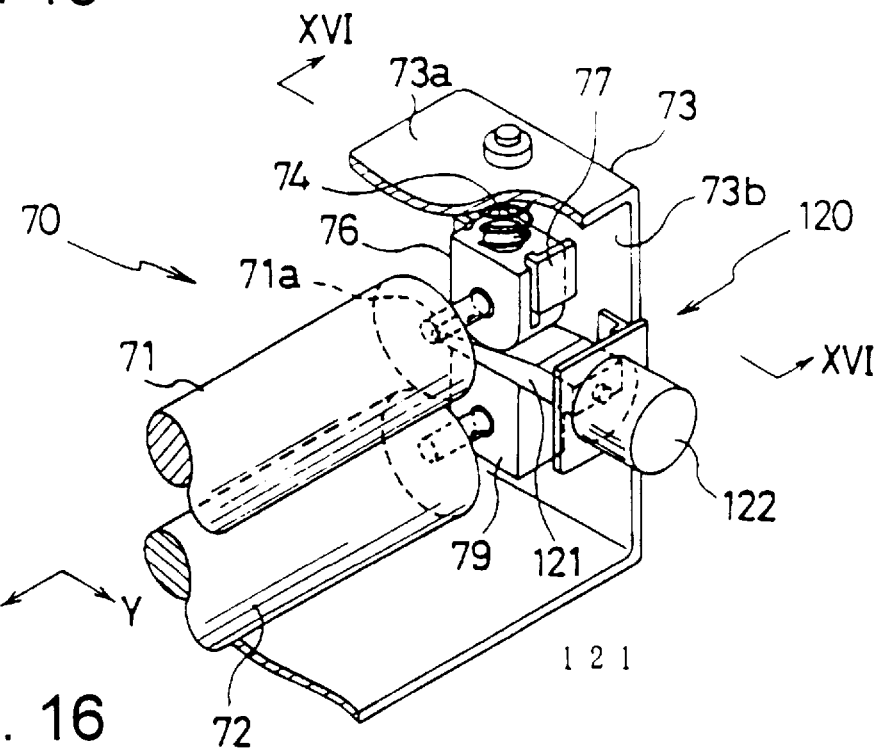
FIG. 15 is a perspective view showing the essential parts of a modified embodiment of the developing mechanism.
Figure 16:
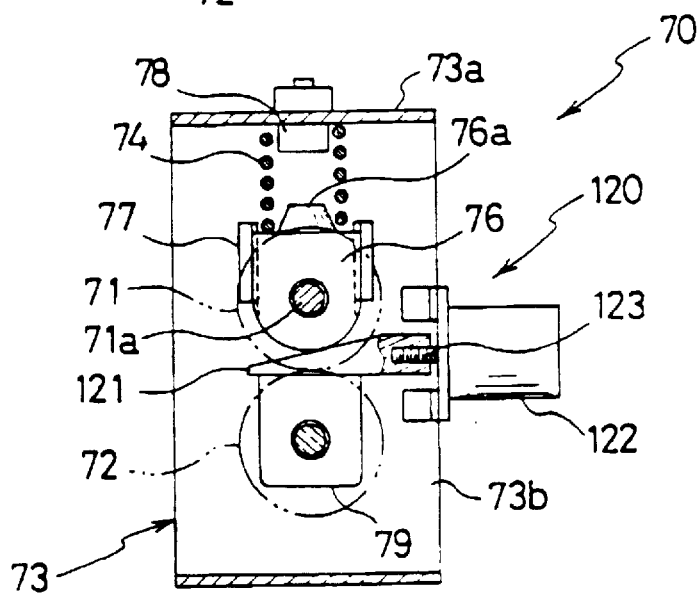
FIG. 16 is a view in cross section taken along line XVI—XVI of FIG. 15.

In the roller switching mechanism 120 shown in FIG. 15 and 16, a wedge member 121 is inserted between the bearing block 76 and the bearing member 79, an electric motor 122 provided in the Y direction is attached to the vertical wall 73b of the frame 73, a threaded shaft 123 is fixed to the output axis of the motor 122, the threaded shaft 123 is inserted into and engages the thread of the tapped hole of the wedge member 121, the wedge member 121 is driven by the motor 122 via the threaded shaft 123 so that it can be moved, when the wedge member 121 has retreated in the Y direction, the upper nip roller 71 is brought into pressure contact with the lower nip roller 72 in the pressing position, and when the wedge member 121 is moved in the opposite direction of the Y direction, the upper nip roller 71 is lifted up by the wedge member 121 so that the upper nip roller 71 is in the separated position where it is separated from the lower nip roller 72. Since the roller switching mechanism 120 is designed so that the driving force of the motor 122 is boosted and transmitted to the bearing block 76 by a booster mechanism, including the wedge member 121, it is possible to reduce the size of the motor 122.

Figure 17:
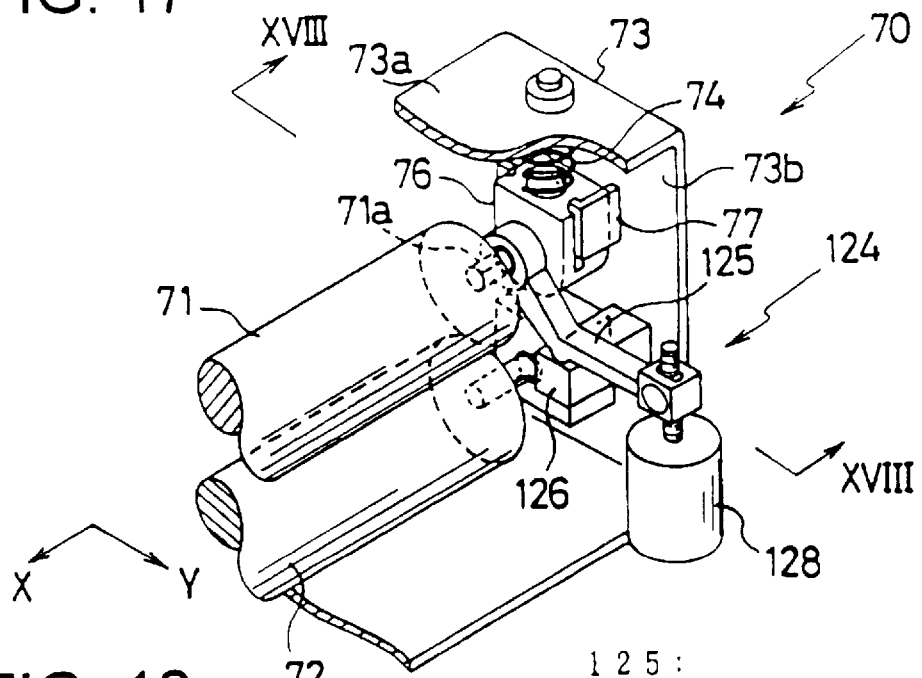
FIG. 17 is a perspective view showing the essential parts of a modified embodiment of the developing mechanism.
Figure 18:
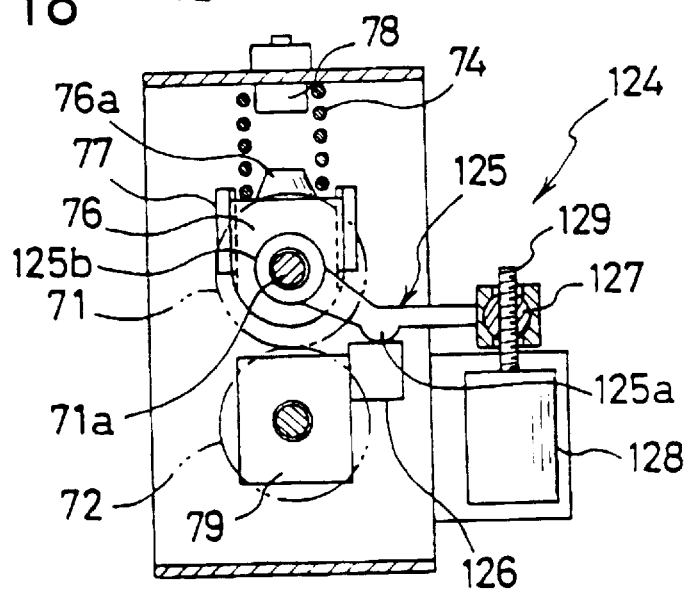
FIG. 18 is a view in cross section taken along line XVIII—XVIII of FIG. 17.
Figure 19:
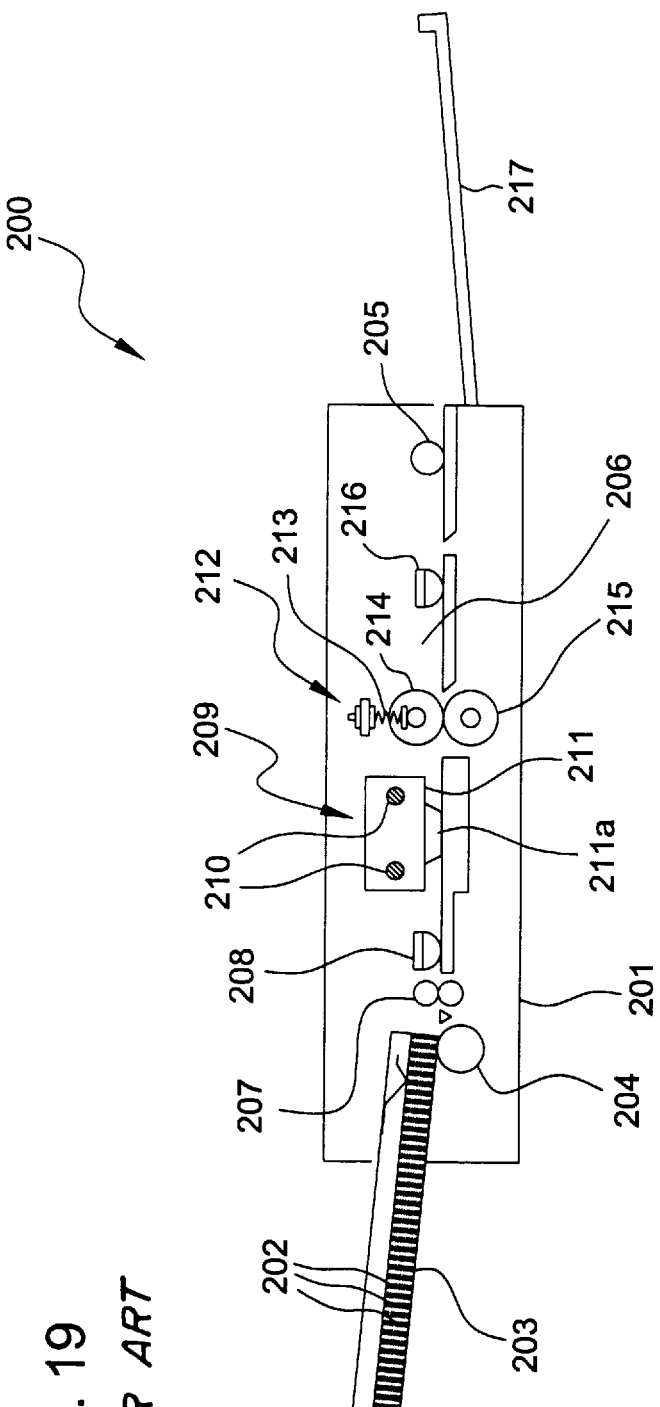
FIG. 19 is a schematic side view of a prior art photo and pressure sensitive printer.
Figure 20:
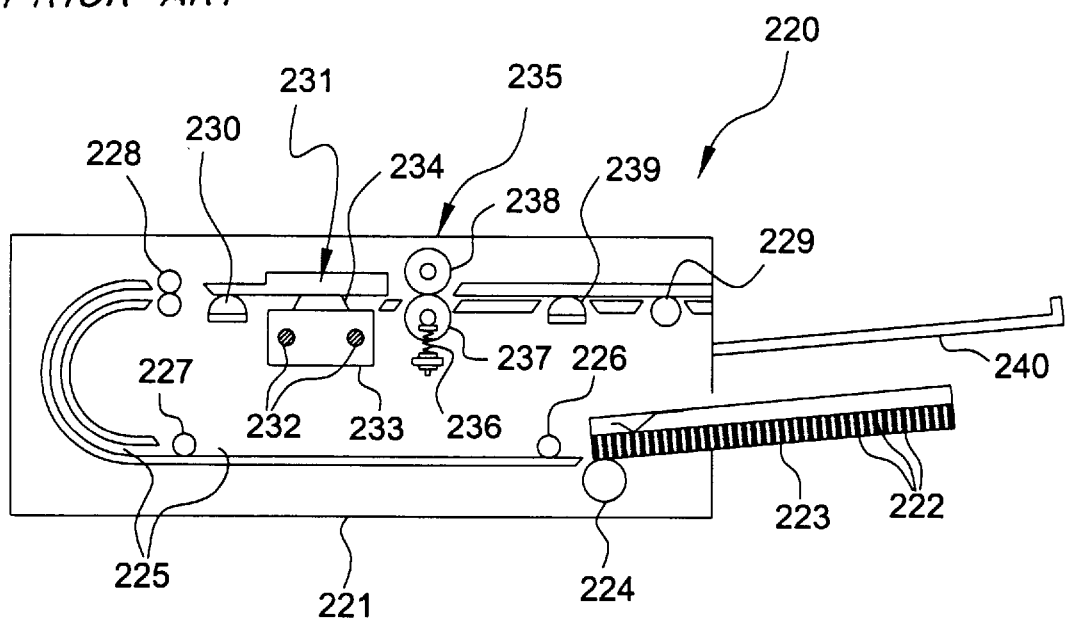
FIG. 20 is a schematic side view of a prior art photo and pressure sensitive printer.

In the roller switching mechanism 124 shown in FIG. 17 and 18 a fulcrum 125a is formed at the underside of a lever 125 in the mid-section thereof, the fulcrum 125a is supported by a fulcrum support 126 attached to the vertical wall 73b, a ring-shaped portion 125b at one end of the lever 125 is slid over the roller axis 71a so that it can rotate freely, at the other end of the lever 125, a threaded nut 127 is provided so that it can move freely around an axis center in the ± X direction, a threaded shaft 129 is fixed to the output axis of an electric motor 128 attached to the vertical wall 73b of the frame 73, and the threaded shaft 129 extends through and engages the threaded nut 127. When maintaining the other end of the lever 125 by means of the motor 128 in the position shown in FIG. 18, the upper nip roller 71 is in the pressing position in which it is in pressure contact with the lower nip roller 72, and when the other end of the lever 125 is pulled down by a predetermined distance by means of the motor 128, the upper nip roller 71 is lifted by the lever principle and switched to the separated position in which it is separated from the lower nip roller 72. In this way, since the driving force of the motor 128 is boosted and transmitted to the roller axis 71a by means of a booster mechanism using the lever principle, it is possible to reduce the size of the motor 128.

5) The mechanism for driving the carriage 51 of the exposure mechanism 50 back and forth in the ± X direction is made so that one guide rod 53 and a threaded shaft are provided in parallel in the ± X direction, the threaded shaft extends through and engages a ball screw on the carriage side, and the carriage 51 is driven back and forth by the stepping motor driving the threaded shaft.

Advantageous Effects of the Invention

According to the present invention, as already mentioned, it becomes possible to shorten the total length of the transport path for transporting the photosensitive recording medium, to reduce the number of parts of the transport system and to simplify the constitution thereof. And by providing the feed path and the discharge path at the front section near the front of the printer housing, a constitution for feeding and discharging at the front of the printer housing, advantageous for the handling of the photosensitive recording medium, becomes possible. And since the reversal path can be formed in a predominantly straight line with the feed path and the discharge path, it becomes possible to reduce the total height of the printer housing. And since, as explained above, the feeding and discharging of the photosensitive recording medium can take place at the front of the printer housing, and the total height of the printer housing can be reduced, it becomes possible to integrate this image forming device into the storage bay 4 of a personal computer.

According to an embodiment of the present invention, since a heating means for heating the photosensitive recording medium is provided so as to face toward the upstream section of the reversal path during forward transport, it is possible to use this heating means for preheating the photosensitive recording medium before exposure and for heat-fixing after exposure and development. Thus, it is possible to use the heating means both for preheating and for heat-fixing, and thereby reduce the necessary wiring and the number of parts of the heating means.

According to yet another embodiment of the present invention, the heating means, developing means, and exposure means are arranged so as to face the reversal path, and so as to be lined up, one after the other, from the upstream side during forward transport, hence, it is possible to use the heating means for preheating during the forward transport of the photosensitive recording medium, after which the exposure means can be used for exposure during forward or reverse transport, and the developing means for developing the photosensitive recording medium during reverse transport, after which the heating means is used for heat-fixing.

According to other embodiments of the present invention, as a roller switching mechanism for switching one nip roller alternately between the separated position and the pressing position by using a booster mechanism such as a level-type, a wedge-type and an eccentric sleeve-type booster mechanism for boosting and transmitting the driving force of a drive motor to one nip roller, it is possible to reduce the size of the drive motor.

According to still another embodiment of the present invention, the roller switching means comprise a drive motor and a wedge-type booster mechanism for boosting and transmitting the driving force of the drive motor to one nip roller, and since the roller switching means is designed so that the driving force of the drive motor is boosted and transmitted by the wedge-type booster mechanism to one nip roller, it is possible to reduce the size of the drive motor.

According to a further embodiment of the present invention, the roller switching means comprise a drive motor and an eccentric sleeve-type booster mechanism for boosting and transmitting the driving force of the drive motor to one nip roller, and since the roller switching means is designed so that the driving force of the drive motor is boosted and transmitted by the eccentric sleeve-type booster mechanism to one nip roller, it is possible to reduce the size of the drive motor.

What is claimed is:

1. An image forming device comprising:
   exposure means for forming a latent image on a photosensitive recording medium based on image information, said photosensitive recording medium having a plurality of microcapsules encapsulating coloring material;
   developing means for developing the latent image by means of the coloring material coming out of the microcapsules when pressure is applied to the photosensitive recording medium; and
   transport means for transporting the photosensitive recording medium along a transport path, said transport path comprising an inlet, a feed path extending from the inlet, an outlet, a discharge path extending to the outlet, and a reversal path along which the photosensitive recording medium is transported forward and backward, the photosensitive recording medium being transported from the feed path to the discharge path via the reversal path.

2. The image forming device according to claim 1, wherein the exposure means and the developing means are provided in the reversal path.

3. The image forming device according to claim 2, wherein the developing means comprise a pair of nip rollers facing each other, and capable of being alternately switched between a pressing position, in which one of the nip rollers is brought into pressure contact with the other, and a separated position in which one of the nip rollers is separated from the other.

4. The image forming device according to claim 3, comprising
   roller switching means for switching the pair of nip rollers between the pressing position and the separated position, wherein
   the pair of nip rollers is switched to the separated position when the recording medium is transported from the feed path to the reversal path, and to the pressing position when the recording medium is transported from the reversal path to the discharge path.

5. The image forming device according to claim 4, further comprising heating means in the reversal path, wherein
   the recording medium is heated by the heating means before being exposed by the exposure means and after being developed by the developing means.

6. The image forming device according to claim 3, wherein the roller switching means comprise a drive motor and a lever-type booster mechanism for boosting and transmitting the driving force of the drive motor to one nip roller.

7. The image forming device according to claim 3, wherein the roller switching means comprise a drive motor and a wedge-type booster mechanism for boosting and transmitting the driving force of the drive motor to one nip roller.

8. The image forming device according to claim 1, wherein the microcapsules comprise a shell and a coloring material encapsulated in this shell, and said shell hardens when exposed to light of a predetermined wavelength.

9. An image forming device comprising:
   image forming means for forming an image on a recording medium based on image information;
   a transport path passing from an inlet to an outlet via the image forming means; and
   transport means for transporting the recording medium along the transport path, said transport path comprising an inlet, a feed path extending from the inlet, an outlet, a discharge path extending to the outlet, and a reversal path along which the photosensitive recording medium is transported forward and backward.

10. The image forming device according to claim 9, wherein the image forming means are provided in the reversal path.

11. The image forming device according to claim 9, wherein the image forming means comprise means for changing the transport direction of the recording medium in the reversal path to the backward direction.

12. Method for forming a latent image on a photosensitive recording medium by exposure based on image information during forward transport along a reversal path, said photosensitive recording medium having a plurality of microcapsules encapsulating coloring material, and for developing the latent image by means of the coloring material coming out of the microcapsules when pressure is applied to the photosensitive recording medium during backward transport along said reversal path.

* * * * *